(12) United States Patent
Bioud et al.

(10) Patent No.: US 12,509,798 B2
(45) Date of Patent: Dec. 30, 2025

(54) SUBSTRATES FOR OPTOELECTRONIC DEVICES AND METHODS OF MANUFACTURING SAME

(71) Applicant: SOCPRA SCIENCES ET GENIE S.E.C., Sherbrooke (CA)

(72) Inventors: Youcef Ataellah Bioud, Sherbrooke (CA); Abderraouf Boucherif, Sherbrooke (CA); Richard Arès, Sherbrooke (CA)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 25 days.

(21) Appl. No.: 18/041,554

(22) PCT Filed: Aug. 19, 2021

(86) PCT No.: PCT/CA2021/051150
§ 371 (c)(1),
(2) Date: Feb. 14, 2023

(87) PCT Pub. No.: WO2022/036454
PCT Pub. Date: Feb. 24, 2022

(65) Prior Publication Data
US 2024/0011193 A1    Jan. 11, 2024

Related U.S. Application Data

(60) Provisional application No. 63/068,537, filed on Aug. 21, 2020.

(51) Int. Cl.
C30B 33/10    (2006.01)
C25F 3/12    (2006.01)
(Continued)

(52) U.S. Cl.
CPC ............... C30B 33/10 (2013.01); C25F 3/12 (2013.01); C30B 29/08 (2013.01); C30B 31/22 (2013.01);
(Continued)

(58) Field of Classification Search
CPC ......... C30B 33/10; C30B 29/08; C30B 31/22; C25F 3/12
See application file for complete search history.

(56) References Cited

U.S. PATENT DOCUMENTS 6,593,625 B2    7/2003    Christiansen et al.
7,037,856 B1 *  5/2006    Maa ................. H01L 21/02664
                                                        438/758
(Continued)

FOREIGN PATENT DOCUMENTS

CN    109360875    2/2019
EP    2664696    11/2013

OTHER PUBLICATIONS

Bioud et al., "Uprooting defects to enable high-performance III-V optoelectronic devices on silicon" (Year: 2019).*

(Continued)

*Primary Examiner* — Nathan T Leong
(74) *Attorney, Agent, or Firm* — Reno Lessard; Norton Rose Fulbright Canada LLP

(57) ABSTRACT

There is described a method of manufacturing a substrate for an optoelectronic device. The method has the steps of: supporting a first layer of a first crystalline material on a second layer of a second crystalline material different from said first crystalline material thereby exposing crystalline defects at a surface of said first layer; etching said first layer using first etching conditions, at least some of said crystalline defects expanding into pores running from said surface of the first layer towards said second layer; and heating said (Continued)

first and second layers up to a first temperature for a first period of time within a given environment, said heating transforming said pores into nanovoids attracting at least some of said crystalline defects away from said surface. In some embodiments, the method has a step of reheating the layers or a step of forming a pore containing region within the first layer.

18 Claims, 16 Drawing Sheets

(51) Int. Cl.
   *C30B 29/08* (2006.01)
   *C30B 31/22* (2006.01)
   *C30B 33/02* (2006.01)
   *H01L 21/02* (2006.01)

(52) U.S. Cl.
   CPC ........ *C30B 33/02* (2013.01); *H01L 21/02381* (2013.01); *H01L 21/0245* (2013.01); *H01L 21/02513* (2013.01)

(56) References Cited

U.S. PATENT DOCUMENTS

| | | | |
|---|---|---|---|
| 8,425,681 | B1 | 4/2013 | Wang et al. |
| 9,343,303 | B2 | 5/2016 | Wang et al. |
| 2012/0018755 | A1 | 1/2012 | Speck et al. |
| 2012/0018758 | A1 | 1/2012 | Matioli et al. |
| 2013/0200391 | A1 | 8/2013 | Bedair et al. |
| 2015/0318355 | A1* | 11/2015 | Wang ............... H01L 21/02639 438/479 |

OTHER PUBLICATIONS

Raissi, Mahfoudh et al. (2014). Low-defect metamorphic Ge(Si) epilayers on Si(001) with a buried template of nanocavities for multiple-junction solar cells. Solar Energy Materials and Solar Cells. 10.1016/j.solmat.2014.10.024.

Follstaedt, D. et al. (1996). Cavity-dislocation interactions in Si—Ge and implications for heterostructure relaxation. Applied Physics Letters. 69. 2059-2061. 10.1063/1.116879.

Frajtag, Pavel et al. (2011). Embedded voids approach for low defect density in epitaxial GaN films. Applied Physics Letters. 98. 023115-023115. 10.1063/1.3540680.

Frajtag, Pavel et al. (2011). Embedded voids formation by overgrowth on GaN nanowires for high-quality GaN films. Journal of Crystal Growth. 322. 27-32. 10.1016/j.jcrysgro_2011.02.032.

Myers, S. et al. 1999). Forces between cavities and dislocations and their influence on semiconductor microstructures. Journal of Applied Physics. 86. 3048-3063. 10.1063/1.371167.

Frajtag, Pavel et al. (2011). Improved light-emitting diode performance by conformal overgrowth of multiple quantum wells and fully coalesced p-type GaN on GaN nanowires. Applied Physics Letters—Appl Phys Lett. 98. 10.1063/1.3572032.

Khafagy, Khaled et al. (2018). Impact of embedded voids on thin-films with high thermal expansion coefficients mismatch. Applied Physics Letters. 112. 042109. 10.1063/1.5011394.

Nitta, Shugo et al. (2000). Mass transport and the reduction of threading dislocation in GaN. Applied Surface Science. 159/160. 421-426. 10.1016/S0169-4332(00)00089-1.

Son, Bongkwon et al. (2020). High speed and ultra-low dark current Ge vertical p-i-n photodetectors on an oxygen-annealed Ge-on-insulator platform with GeOx surface passivation. Optics Express. 28. 10.1364/OE.398199.

Bioud, Youcef et al. (2019). Uprooting defects to enable high-performance III-V optoelectronic devices on silicon. Nature Communications. 10. 1-12. 10.1038/s41467-019-12353-9.

* cited by examiner

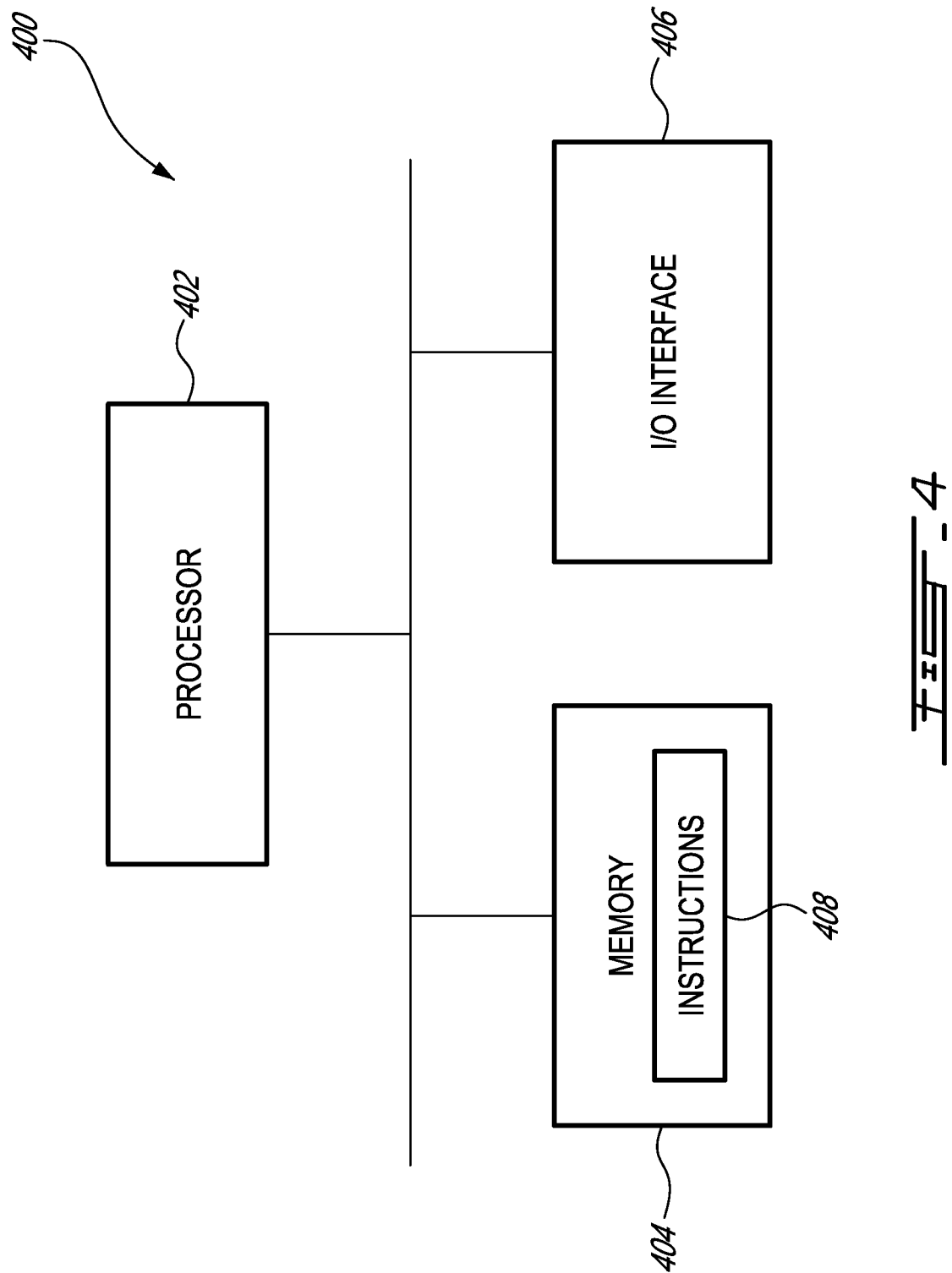

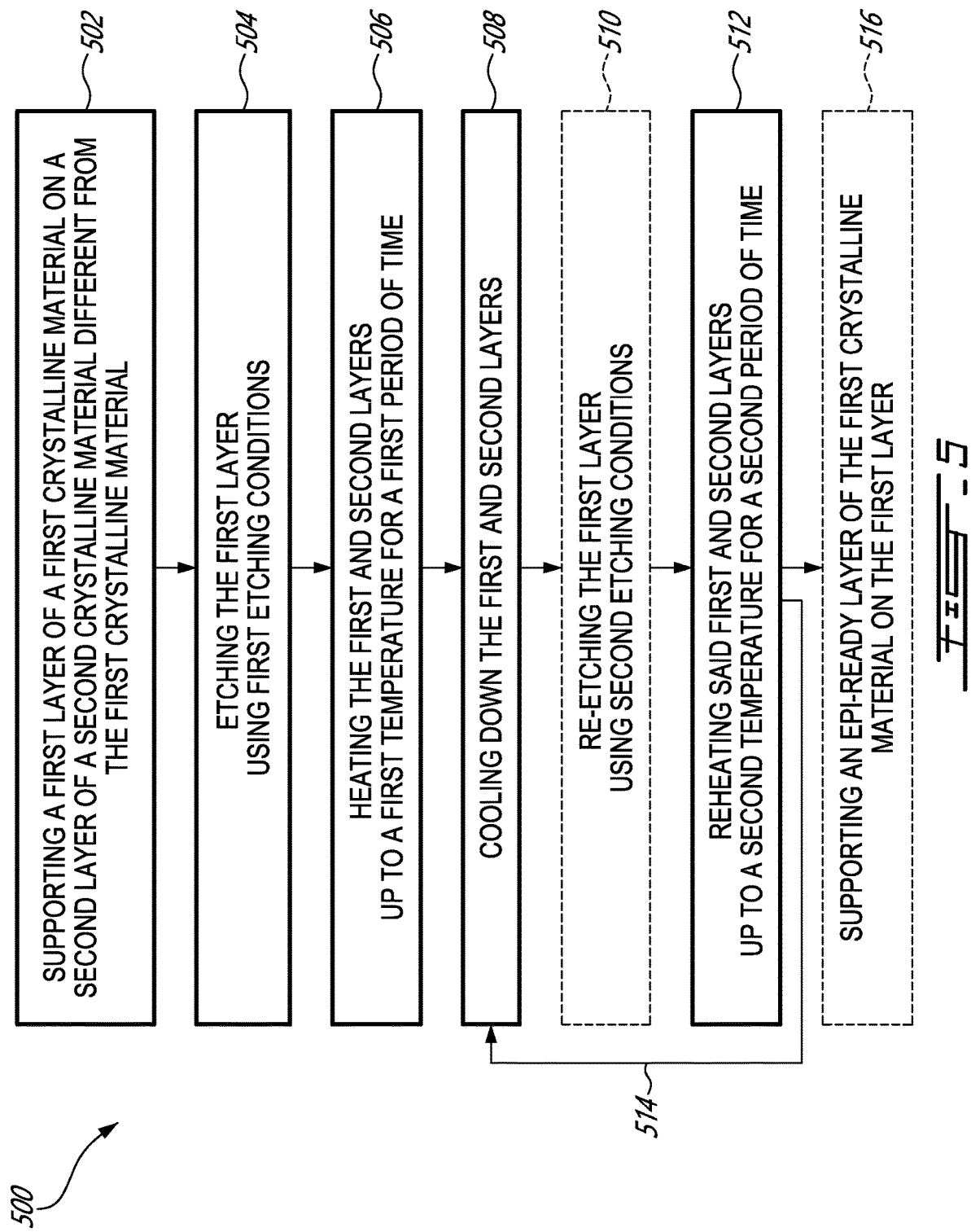

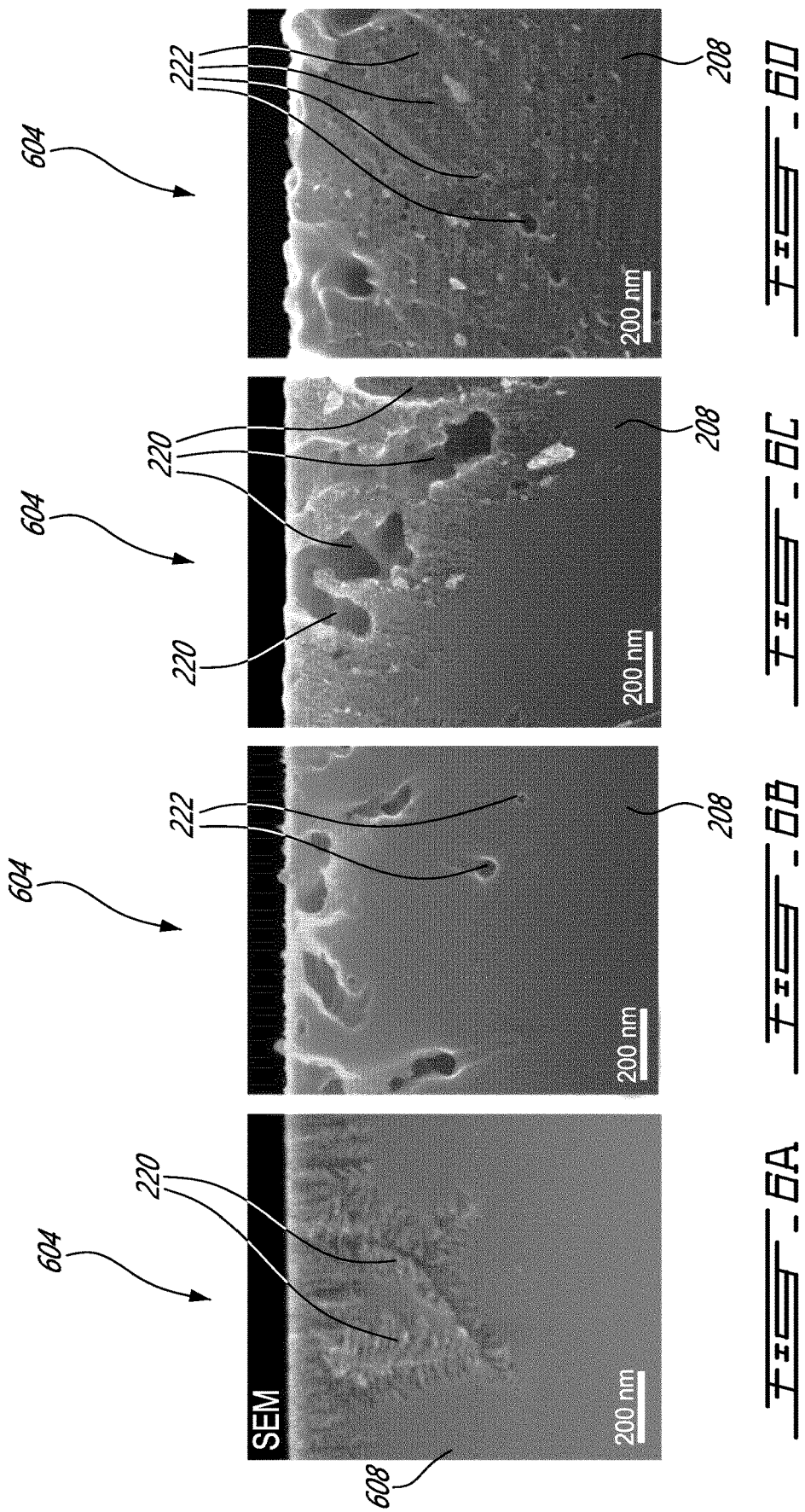

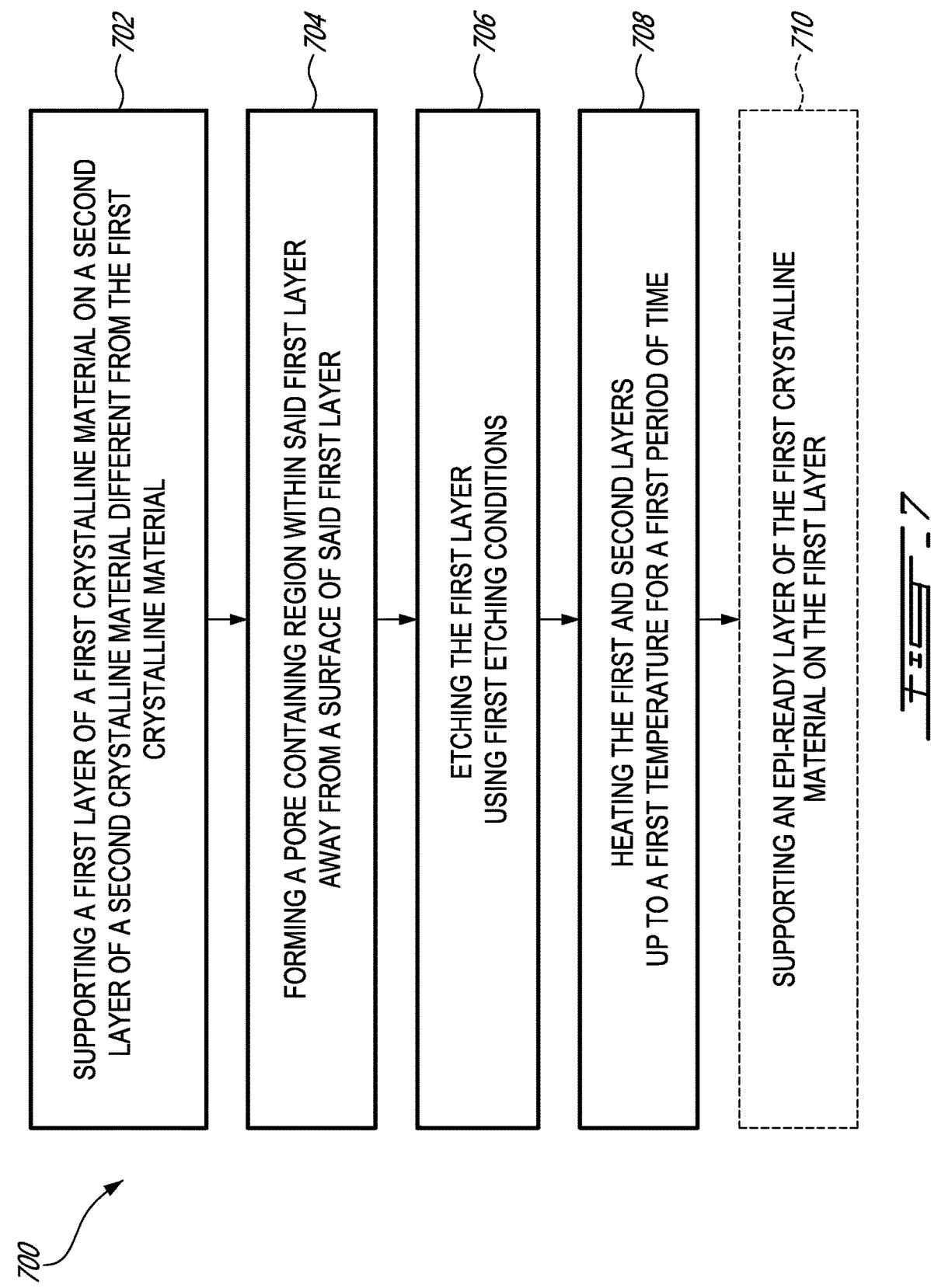

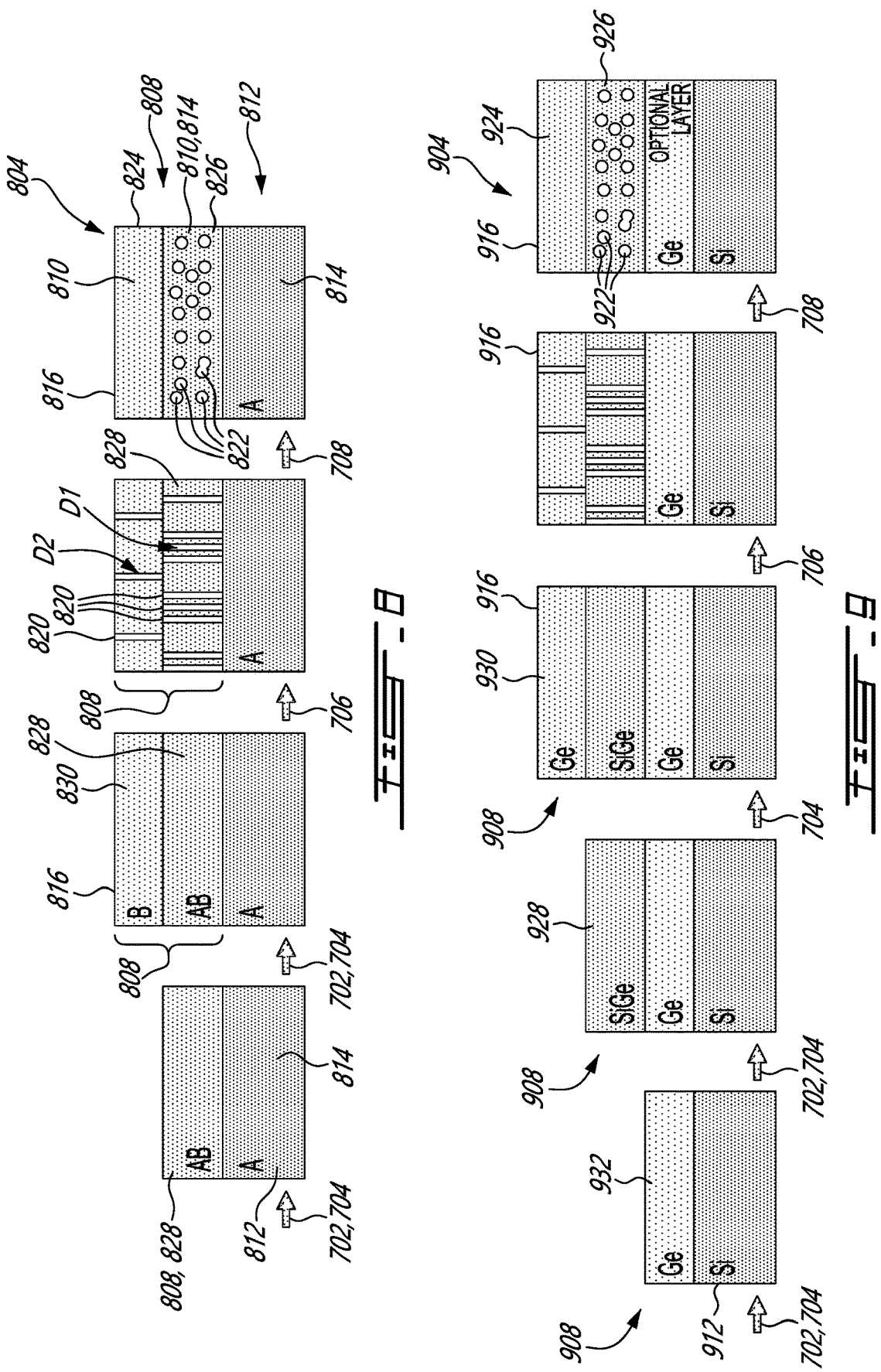

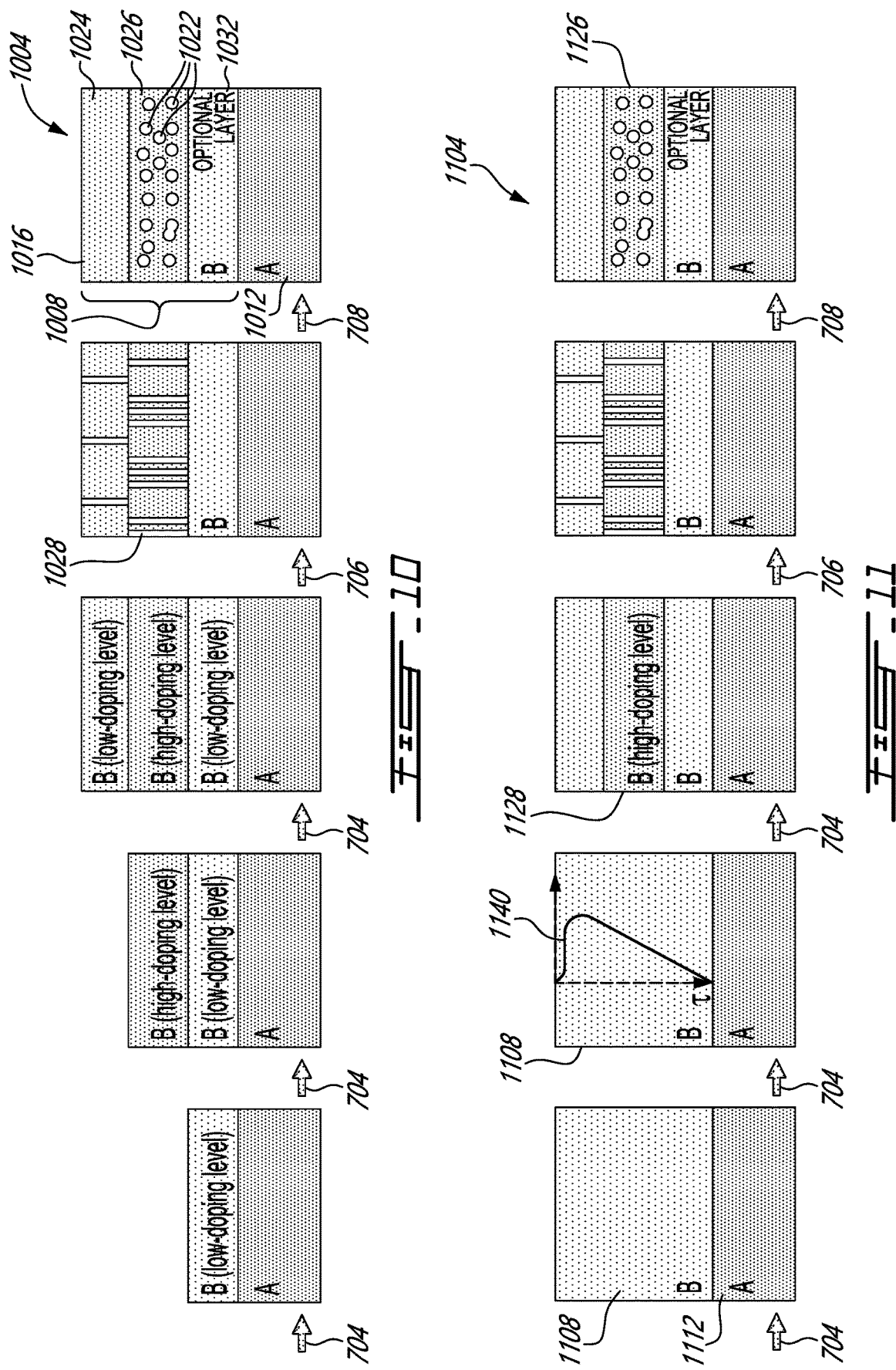

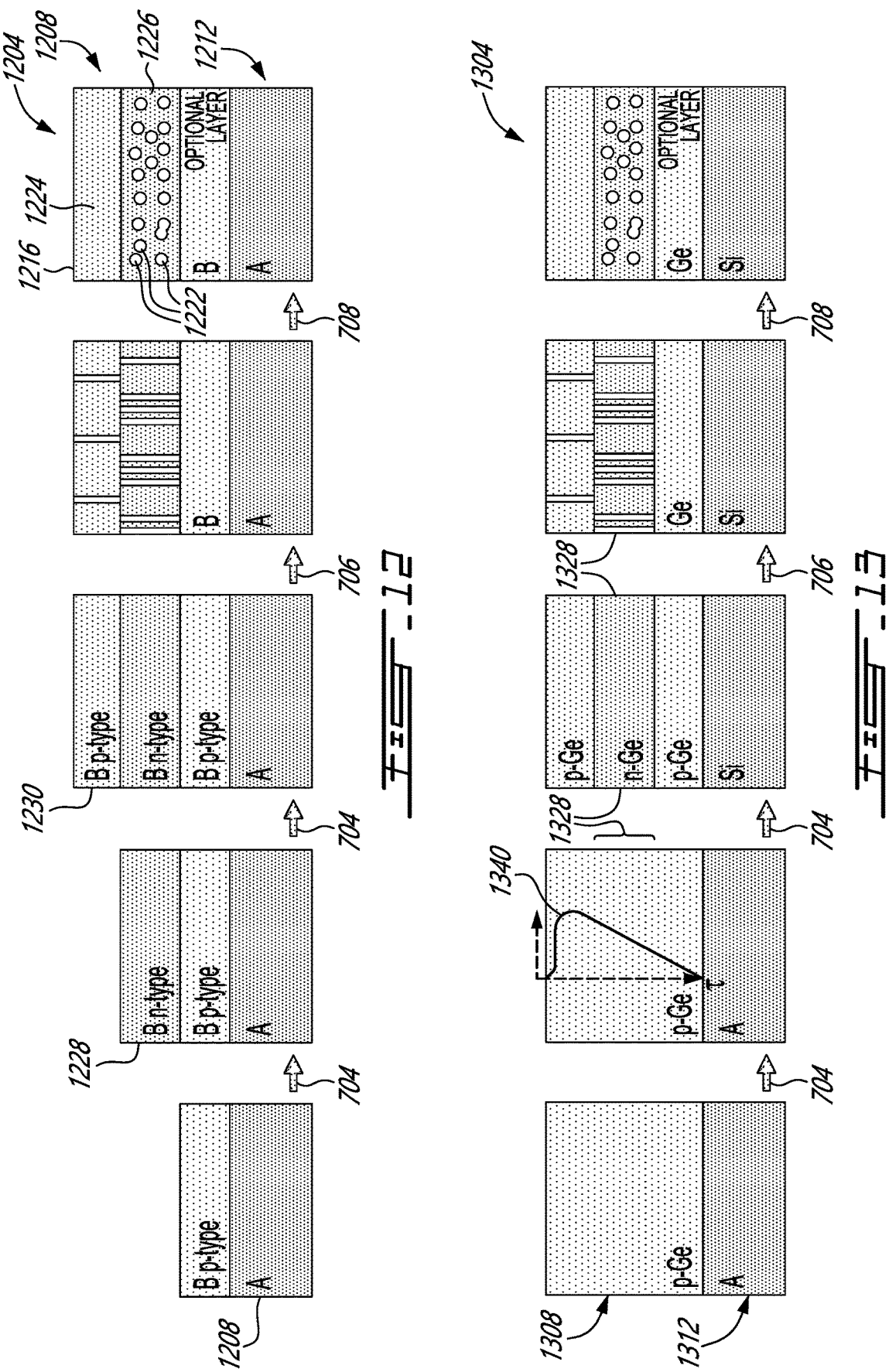

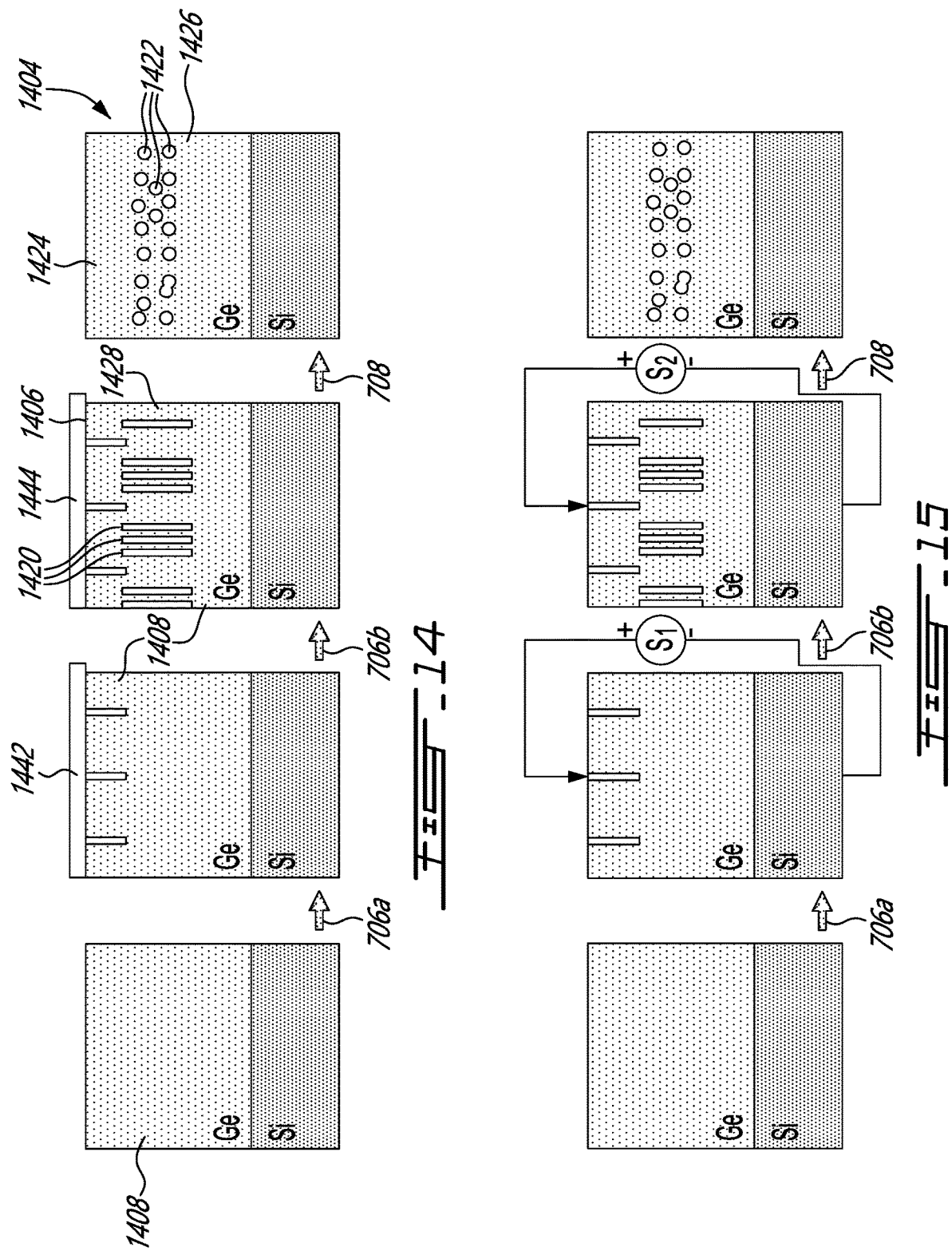

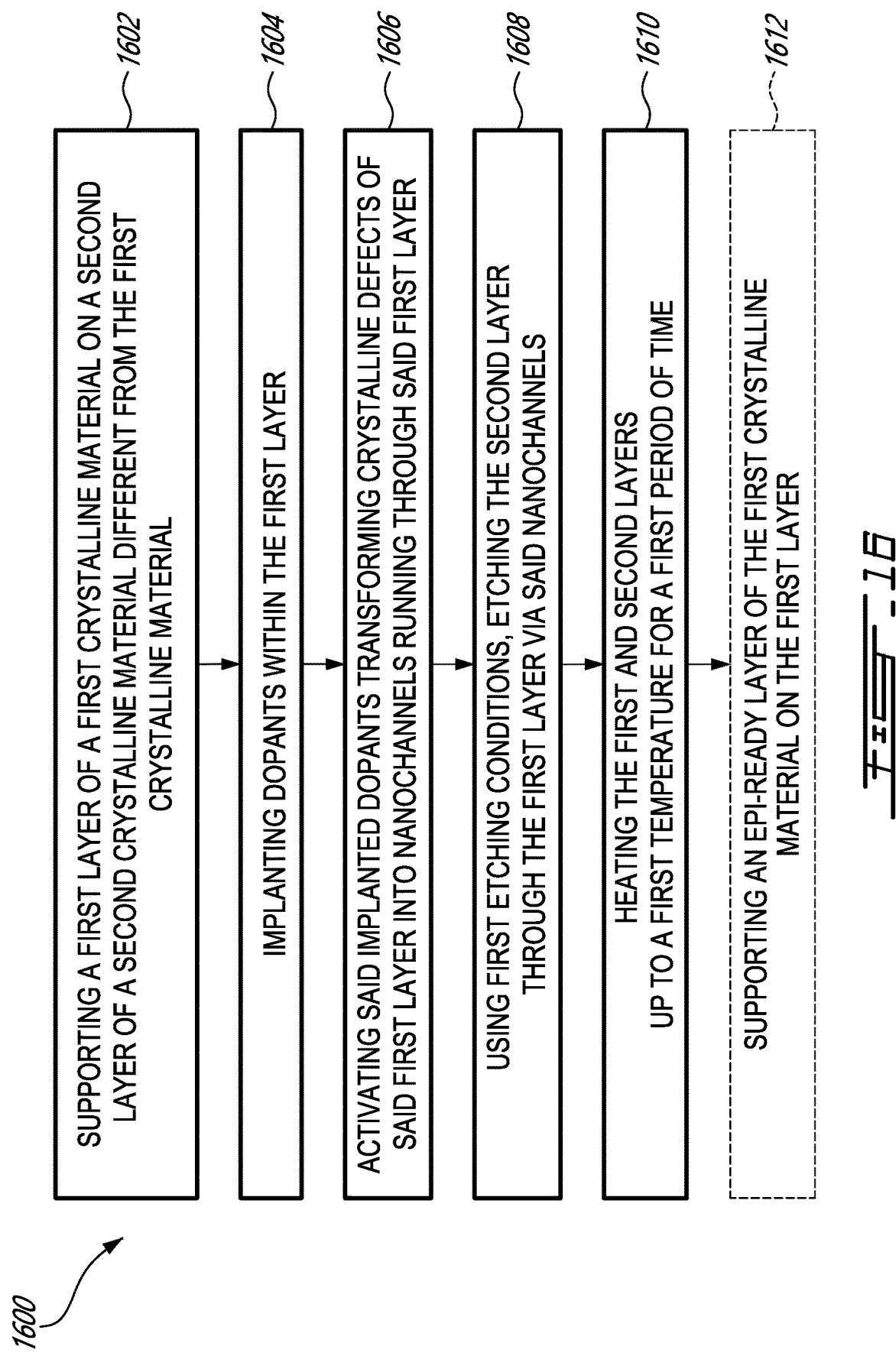

SUBSTRATES FOR OPTOELECTRONIC DEVICES AND METHODS OF MANUFACTURING SAME

FIELD

The improvements generally relate to optoelectronic devices, and more particularly relate to substrates for such optoelectronic devices.

BACKGROUND

Optoelectronic devices generally have semiconductor components grown on substrates. As the semiconductor components and the substrate are typically made of different crystalline materials, the semiconductor's lattice constant is preferably matched to the substrate's lattice constant to avoid undesirable crystalline defects. For instance, semiconductor components based on III-V semiconductors such as InGaAs and GaInNAs are generally grown on bulk germanium substrates, as the lattice constants of germanium and of III-V semiconductors are similar to one another. Although existing substrates for optoelectronic devices have been found to be satisfactory, there remains room for improvement.

SUMMARY

It was found that there is a need in the industry to provide substrates for optoelectronic devices which are not wholly made of costly bulk material such as germanium.

In an aspect, it was found convenient to provide substrates comprising a first layer of a first crystalline material supported on a second layer of a second crystalline material. In this way, the first crystalline material of the first layer can be selected to exhibit a lattice constant matched to a lattice constant of semiconductor components to be grown thereon, while the second layer, which acts as a supporting layer for the first layer, can be made of less expensive crystalline material. For instance, in embodiments where III-V semiconductor components are to be grown on such substrates, the first crystalline material can be germanium whereas the second crystalline material can be silicon. However, it was found that as the first and second crystalline materials of such substrates are different from one another, crystalline defects can appear at a surface of the first layer thereby introducing challenges in the growth of semiconductor components thereon. To reduce the density of these surface crystalline defects, it was found useful to etch the first layer using first etching conditions thereby causing at least some of the crystalline defects to expand into pores running from the surface of the first layer towards the second layer. Then, the first and second layers are heated up to a first temperature for a first period of time within a given environment. This latter step transforms the pores into nanovoids which attract at least some of the undesirable crystalline defects away from the surface, thereby reducing the density of the crystalline defects exposed at the surface of the substrate.

The present disclosure presents a number of method steps improving the aforementioned method, thereby increasing the reduction of the crystalline defect density on a surface of a bi- or multi-layer substrate.

In some embodiments, the multi-layer substrate is cooled down for a given period of time after which it is reheated at a second temperature for a second period of time within a given environment. It was found that performing this sole step of reheating can reduce the surface crystalline defect density and thereby provide an improved substrate for optoelectronic devices.

In some embodiments, the multi-layer substrate is cooled down for a given period of time after which it is both re-etched using second etching conditions and reheated at a second temperature for a second period of time within a given environment. It was found that performing one or more iterations of the re-etching and reheating steps can increase the void density and thereby reduce the surface crystalline defect density, improving the multi-layer substrate for optoelectronic device growth.

In some embodiments, a pore containing region is formed within the first layer of the multi-layer substrate and away from its exposed surface. The pore containing region can contribute in, upon said step(s) of heating, concealing the defect-attracting nanovoids away from the exposed surface of the first layer, thereby improving the multi-layer substrate for optoelectronic growth altogether.

In some embodiments, dopants are implanted within the first layer, and then activated thereby transforming some crystalline defects into nanochannels extending from the exposed surface of the first layer to the second layer. By doing so, in the etching step, etchant flows through the nanochannels towards the second layer, which causes some crystalline defects of the second layer to expand into pores within the second layer. By heating the multi-layer substrate, the pores of the second layer transform into defect-attracting nanovoids distributed in the second layer and at the interface of the first and second layers, away from the exposed surface. This is yet another method of improving multi-layer substrate for optoelectronic growth altogether.

In accordance with a first aspect of the present disclosure, there is provided a method of manufacturing a substrate for an optoelectronic device, the method comprising: supporting a first layer of a first crystalline material on a second layer of a second crystalline material being different from said first crystalline material thereby exposing crystalline defects at a surface of said first layer; etching said first layer using first etching conditions, at least some of said crystalline defects expanding into pores running from said surface of the first layer towards said second layer; and heating said first and second layers up to a first temperature for a first period of time within a given environment, said heating transforming said pores into nanovoids attracting at least some of said crystalline defects away from said surface.

Further in accordance with the first aspect of the present disclosure, the method can for example further comprise cooling down said first and second layers and reheating said first and second layers up to a second temperature for a second period of time.

Still further in accordance with the first aspect of the present disclosure, said second temperature can for example be greater than said first temperature.

Still further in accordance with the first aspect of the present disclosure, said first temperature can for example be at least 550° C. and said second temperature can for example be at least 700° C.

Still further in accordance with the first aspect of the present disclosure, said second period of time can for example be greater than said first period of time.

Still further in accordance with the first aspect of the present disclosure, said first period of time can for example be at least 5 minutes and said second period of time can for example be at least 10 minutes.

Still further in accordance with the first aspect of the present disclosure, the method can for example further comprise, prior to said reheating, re-etching said first layer using second etching conditions.

Still further in accordance with the first aspect of the present disclosure, said first and second etching conditions can for example be different from each other.

Still further in accordance with the first aspect of the present disclosure, said supporting can for example comprise forming a pore containing region within said first layer away from said surface, the pore containing region having, upon said etching, a density of crystalline defects expanding into pores being greater than elsewhere within the first layer thereby concealing, upon said heating, the nanovoids within said pore containing region and defining a nanovoid-free region between said pore containing region and said surface.

Still further in accordance with the first aspect of the present disclosure, said pore containing region can for example be made of an alloy comprising both the first and second crystalline materials.

Still further in accordance with the first aspect of the present disclosure, said forming can for example comprise growing said alloy upon said second layer thereby forming said pore containing region, and then growing said first crystalline material on said pore containing region.

Still further in accordance with the first aspect of the present disclosure, the pore containing region can for example have a doping level being greater than a doping level of elsewhere within the first layer.

Still further in accordance with the first aspect of the present disclosure, said forming can for example further comprise growing said first crystalline material with a first doping level upon said second layer thereby forming said pore containing region, and then growing said first crystalline material with a second doping level being lower than the first doping level on said pore containing region thereby forming said nanovoid-free region.

Still further in accordance with the first aspect of the present disclosure, said forming can for example further comprise growing said first crystalline material with a first doping level upon said second layer, and then implanting dopants within a region of said first layer thereby increasing a doping level of said region from the first doping level to the second doping level, said region acting as said pore containing region after said implanting.

Still further in accordance with the first aspect of the present disclosure, the pore containing region can for example have one of a n-type dopant and a p-type dopant, the nanovoid-free region having the other one of the n-type dopant and the p-type dopant.

Still further in accordance with the first aspect of the present disclosure, said forming can for example further comprise growing said first crystalline material with the one of the n-type dopant and the p-type dopant upon said second layer thereby forming said pore containing region, and then growing said first crystalline material with the other one of the n-type dopant and the p-type dopant on said pore containing region thereby forming said nanovoid-free region.

Still further in accordance with the first aspect of the present disclosure, said forming can for example comprise growing said first crystalline material with the other one of the n-type dopant and the p-type dopant upon said second layer, and then implanting the one of the n-type dopant and the p-type dopant within a region of said first layer, said region acting as the pore containing region after said implanting.

Still further in accordance with the first aspect of the present disclosure, said etching can for example comprise a first step of etching the first layer with first etching conditions and then a second step of etching the etched first layer with second etching conditions, the second step of etching forming a pore containing region within said first layer away from said surface, the pore containing region having, upon said steps of etching, a density of crystalline defects expanding into pores being greater than elsewhere within the first layer thereby concealing, upon said heating, the nanovoids within said pore containing region and defining a nanovoid-free region between said pore containing region and said surface.

Still further in accordance with the first aspect of the present disclosure, the first etching conditions can for example involve a first electrolyte solution and wherein the second etching conditions can for example involve a second electrolyte solution being more etchant than the first electrolyte solution.

Still further in accordance with the first aspect of the present disclosure, the first electrolyte solution can for example comprise a given electrolyte at a first concentration and wherein the second electrolyte solution can for example comprise the given electrolyte at a second concentration being greater than the first concentration.

Still further in accordance with the first aspect of the present disclosure, the first electrolyte solution can for example comprise a first electrolyte and wherein the second electrolyte solution comprises a second electrolyte being more etchant than the first electrolyte.

Still further in accordance with the first aspect of the present disclosure, the first etching conditions can for example involve applying a first oscillating current and wherein the second etching conditions can for example involve applying a second oscillating current, the first and second oscillating currents being different from one another.

Still further in accordance with the first aspect of the present disclosure, the method can for example further comprise, prior to said etching, implanting dopants uniformly within the first layer, said implanted dopants being attracted proximate to said crystalline defects, activating the implanted dopants thereby transforming at least some of the crystalline defects into nanochannels running from the surface of the first layer down to the second layer, wherein said step of etching is performed through said first layer via said nanochannels, at least some of the crystalline defects expanding into pores running within the second layer and away from the first layer, said heating transforming said pores of said second layer into nanovoids attracting at least some of said crystalline defects within said second layer and away from said first layer, thereby defining a nanovoid-free region within first second layer.

Still further in accordance with the first aspect of the present disclosure, said activating can for example further comprise heating the first and second layers to a given temperature for a given period of time.

In accordance with a second aspect of the present disclosure, there is provided a substrate for an optoelectronic device, the substrate comprising: a first layer of a first crystalline material supported on a second layer of a second crystalline material different from the first crystalline material, the first layer comprising a nanovoid-free region exposing a surface of the first layer, and a nanovoid concealing region at least one of below and at an interface with said nanovoid-free region and away from said exposed surface, the nanovoid concealing region comprising an alloy comprising both the first and second crystalline materials and a plurality of defect-attracting nanovoids distributed therewithin.

Further in accordance with the second aspect of the present disclosure, the first crystalline material can for example be germanium, the second crystalline material can for example be silicon, and the alloy can for example have silicon-germanium.

Still further in accordance with the second aspect of the present disclosure, the first layer can for example have a plurality of regions layered upon one another, the regions having the nanovoid free region comprising the exposed surface, the nanovoid concealing region and at least another region between the nanovoid concealing region and the second layer.

In accordance with a third aspect of the present disclosure, there is provided a substrate for an optoelectronic device, the substrate comprising: a first layer of a first crystalline material supported on a second layer of a second crystalline material different from the first crystalline material, the first layer comprising a nanovoid-free region having a first doping level and exposing a surface of the first layer, and a nanovoid concealing region at least one of below and at an interface with said nanovoid-free region and away from said exposed surface, the nanovoid concealing region having a second doping level being greater than the first doping level and a plurality of defect-attracting nanovoids distributed therewithin.

Further in accordance with the third aspect of the present disclosure, a difference between the first and second doping levels can for example be at least an order of magnitude when measured in terms of dopants per cubic centimetres.

Still further in accordance with the third aspect of the present disclosure, said difference can for example be at least two orders of magnitude when measured in terms of dopants per cubic centimetres.

In accordance with a fourth aspect of the present disclosure, there is provided a substrate for an optoelectronic device, the substrate comprising: a first layer of a first crystalline material supported on a second layer of a second crystalline material different from the first crystalline material, the first layer comprising a nanovoid-free region having one of a n-type dopant and a p-type dopant and exposing a surface of the first layer, and a nanovoid concealing region at least one of below and at an interface with said nanovoid-free region and away from said exposed surface, the nanovoid concealing region having the other one of the n-type dopant and the p-type dopant and a plurality of defect-attracting nanovoids distributed therewithin.

Further in accordance with the fourth aspect of the present disclosure, the nanovoid-free region can for example have an n-type dopant and the nanovoid concealing region has a p-type dopant.

Still further in accordance with the fourth aspect of the present disclosure, there is provided an optoelectronic device comprising a semiconductor component and the substrate of any one of the aspects described above, the substrate received the semiconductor component.

In accordance with a fifth aspect of the present disclosure, there is provided a method of manufacturing a substrate for an optoelectronic device, the method comprising: supporting a first layer of a first crystalline material on a second layer of a second crystalline material being different from said first crystalline material thereby causing crystalline defects at an interface of said first and second layers; and etching said second layer using first etching conditions, at least some of said crystalline defects expanding into pores running within said second layer and attracting at least some of said crystalline defects away from said interface.

Further in accordance with the fifth aspect of the present disclosure, the method can for example further comprise heating said first and second layers up to a first temperature for a first period of time within a given environment.

Still further in accordance with the fifth aspect of the present disclosure, the method can for example further comprise cooling down said first and second layers and reheating said first and second layers up to a second temperature for a second period of time.

Still further in accordance with the fifth aspect of the present disclosure, said second temperature can for example be greater than said first temperature.

Still further in accordance with the fifth aspect of the present disclosure, said first temperature can for example be at least 550° C. and said second temperature can for example be at least 700° C.

Still further in accordance with the fifth aspect of the present disclosure, said second period of time can for example be greater than said first period of time.

Still further in accordance with the fifth aspect of the present disclosure, said first period of time can for example be at least 5 minutes and said second period of time can for example be at least 10 minutes.

Still further in accordance with the fifth aspect of the present disclosure, the method can for example further comprise, prior to said reheating, re-etching said second layer using second etching conditions.

Still further in accordance with the fifth aspect of the present disclosure, said first and second etching conditions can for example be different from each other.

Still further in accordance with the fifth aspect of the present disclosure, said supporting can for example further comprise forming a pore containing region within said second layer, the pore containing region having, upon said etching, a density of crystalline defects expanding into pores being greater than elsewhere within the second layer.

It is noted that the methods described herein have experimentally demonstrated that the threading dislocation density exposed to the surface of the first layer can be reduced. However, it is expected that the methods described herein can be used to reduce the density of other types of crystalline defects exposed within the first layer. Examples of such crystalline defects can include, but are not limited to, point defect(s) such as atom(s) vacancy(ies) and impurity(ies), line defect(s) such as misfit dislocation(s), threading dislocation(s) and the like.

Many further features and combinations thereof concerning the present improvements will appear to those skilled in the art following a reading of the instant disclosure.

DESCRIPTION OF THE FIGURES

In the figures,

FIG. 4 is a schematic view of an example of a computing device of the controller of FIG. 3, in accordance with one or more embodiments;

FIG. 5 is a flow chart of a first example of a method of manufacturing substrates for optoelectronic devices, showing at least two cycles each having an optional etching step and a heating step, in accordance with one or more embodiments;

FIG. 6A is scanning electron microscopy image of an example substrate after a first etching step, showing a first pore density, in accordance with one or more embodiments;

FIG. 6B is scanning electron microscopy image of the substrate of FIG. 6A after a first heating step, showing a first defect-attracting nanovoid density, in accordance with one or more embodiments;

FIG. 6C is scanning electron microscopy image of the substrate of FIG. 6B after a second etching step, showing a second pore density greater than the first pore density, in accordance with one or more embodiments;

FIG. 6D is scanning electron microscopy image of the substrate of FIG. 6C after a second heating step, showing a second defect-attracting nanovoid density greater than the first defect-attracting nanovoid density, in accordance with one or more embodiments;

FIG. 6E is a scanning electron microscopy image of the substrate of FIG. 6D after an optional epi-ready layer has been grown on the first layer, in accordance with one or more embodiments;

FIG. 7 is a flow chart of a second example of a method of manufacturing substrates for optoelectronic devices, incorporating a step of forming a pore containing region within the first layer, in accordance with one or more embodiments;

FIG. 8 is a schematic view of a first example of a substrate manufactured using the method of FIG. 7, showing a pore containing region comprising an alloy having first and second crystalline materials, in accordance with one or more embodiments;

FIG. 9 is a schematic view of a second example of a substrate manufactured using the method of FIG. 7, showing a pore containing region comprising an alloy having germanium and silicon, in accordance with one or more embodiments;

FIG. 10 is a schematic view of a third example of a substrate manufactured using the method of FIG. 7, showing a pore containing region being grown on the second layer in successive growth steps, the pore containing region comprising a doping level greater than a doping level of elsewhere within the first layer of the substrate, in accordance with one or more embodiments;

FIG. 11 is a schematic view of a fourth example of a substrate manufactured using the method of FIG. 7, showing a pore containing region comprising a doping level greater than a doping level of elsewhere within the first layer of the substrate, the pore containing region being obtained using ion implantation, in accordance with one or more embodiments;

FIG. 12 is a schematic view of a fifth example of a substrate manufactured using the method of FIG. 7, showing a pore containing region being grown on the second layer in successive growth steps, the pore containing region having n- or p-type dopant whereas elsewhere within the first layer of the substrate has p- or n-type dopant, in accordance with one or more embodiments;

FIG. 13 is a schematic view of a sixth example of a substrate manufactured using the method of FIG. 7, showing a pore containing region having n- or p-type dopant whereas elsewhere within the first layer of the substrate has p- or n-type dopant, the pore containing region being obtained using ion implantation, in accordance with one or more embodiments;

FIG. 14 is a schematic view of a seventh example of a substrate manufactured using the method of FIG. 7, showing a pore containing region obtained using first etching conditions, in accordance with one or more embodiments;

FIG. 15 is a schematic view of an eighth example of a substrate manufactured using the method of FIG. 7, showing a pore containing region obtained using second etching conditions different from the first etching conditions, in accordance with one or more embodiments;

FIG. 16 is a flow chart of a third example of a method of manufacturing substrates for optoelectronic devices, incorporating a step of implanting dopants within the first layer of the substrate and a step of activating the implanted dopants, in accordance with one or more embodiments;

DETAILED DESCRIPTION

Figure 1:
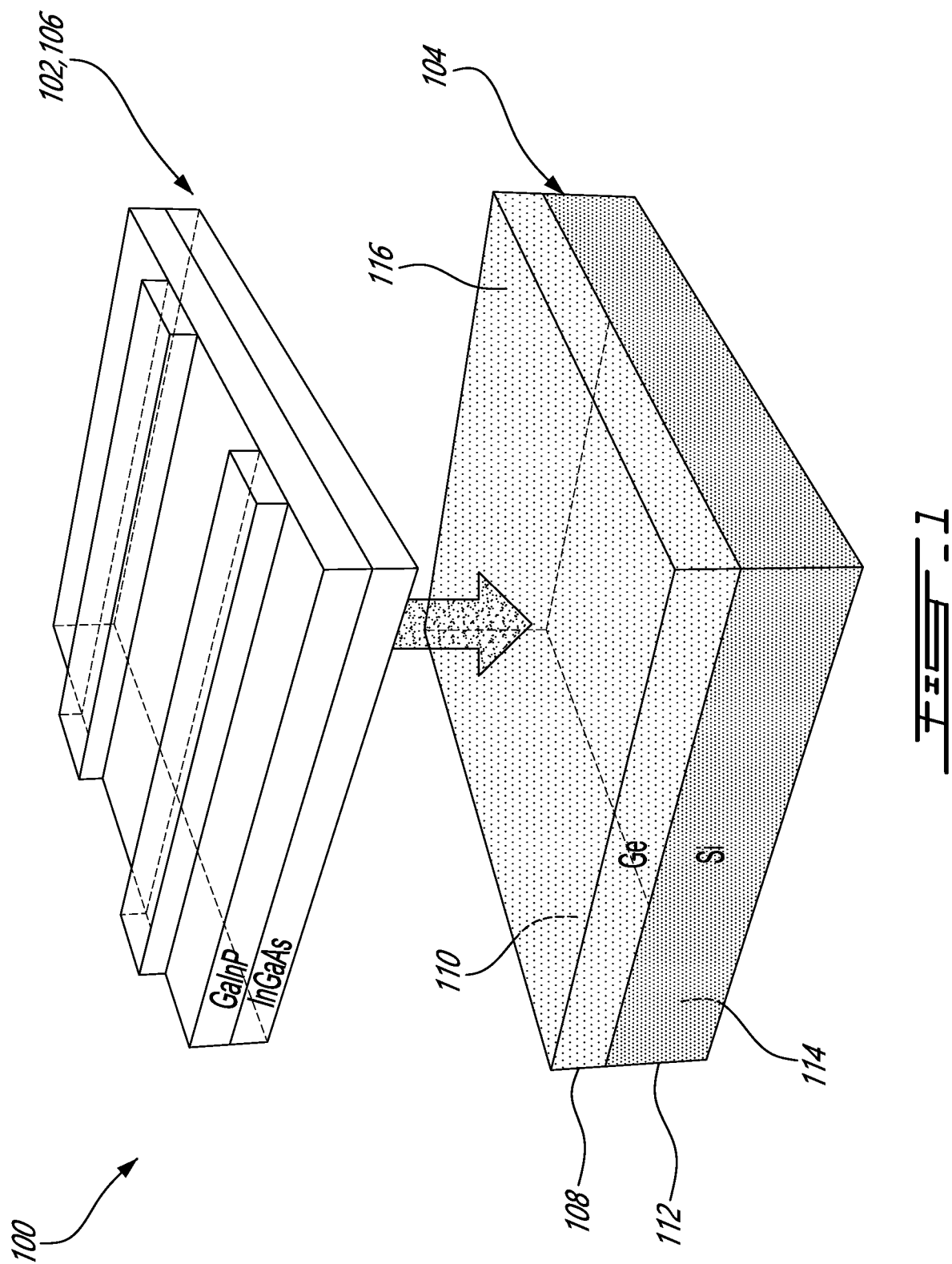
FIG. 1 is an oblique view of an example of an optoelectronic device having a III-V semiconductor component to be grown on an exemplary substrate, in accordance with one or more embodiments.

FIG. 1 is an exploded view of an example optoelectronic device 100 having a semiconductor component 102 grown on a multi-layer substrate 104 (hereinafter "the substrate 104"). Examples of such semiconductor components can include, but not limited to, photodiodes, solar cells, phototransistors, photomultipliers, optoisolators, integrated optical circuit elements, photoresistors, charge-coupled imaging devices, laser diodes, quantum cascade lasers, light-emitting diodes, organic light emitting diodes, photoemissive camera tubes, transducers, thermophovoltaics, quantum devices and the like. It is envisaged that the semiconductor components can include Silicon-based group IV heterostructures (e.g., Ge/Si, GeSn/Si, SiGeSn/Si, SiC/Si, etc.), III-V heterostructures on Silicon such as Gallium Nitride on Silicon (GaN/Si), Aluminum nitride on Silicon (AlN/Si), Gallium Arsenide on Si (GaAs/Si), Gallium Phosphide on Si (GaP/Si), Indium Gallium Arsenide on Si (InGaAs/Si), Aluminum Indium Nitride on Si (AlInN/Si), Gallium Indium Nitride on Si (GaInN/Si), and other types of suitable semiconductor heterostructures. To avoid crystalline mismatch between the semiconductor component 102 and the substrate 104, their lattice constants are preferably matched to one another. For instance, in embodiments where the semiconductor component 102 is a III-V semiconductor component 106, the substrate 104 can have a layer of a lattice matched crystalline material such as germanium, as germanium has a lattice constant substantially close to that of III-V semiconductors such as GaAs, InGaAs, GaInP, AlGaAsP, InGaAsP, AlGaInP, InAlGaP, InGaAlP, AlInGaP and the like.

In this disclosure, there are described substrates for such optoelectronic devices 100. As depicted, the substrates are only partially made of the lattice matched crystalline material to save costs, to name an example advantage. More specifically, in this example, the substrate 104 has a first layer 108 of a first crystalline material 110 supported on a second layer 112 of a second crystalline material 114 different from the first crystalline material 110. For instance, if the semiconductor component is to be made of a III-V semiconductor, the first crystalline material can be germanium whereas the second crystalline material can be germanium. As shown, the second layer 112 can act as a supporting layer for the first layer 108. However, undesirable crystalline defects can arrive from using the multilayered substrate 104 due to a potential lattice constant mismatch between the first and second crystalline materials 110 and 114 of the first and second layers 108 and 112. When those crystalline defects run towards a component receiving surface 116 (hereinafter referred to "the exposed surface" or "the surface") of the first layer 108, the substrate 104 may be ill-suited to receive semiconductor components thereon. To reduce the undesirable effects of such a lattice constant mismatch, it was found that the density of undesirable crystalline defects appearing within the substrate 104 can be reduced by processing the substrate 104 with a series of processing steps. Some of these processing steps are described with reference to FIGS. 2A to 2C.

Figure 2:
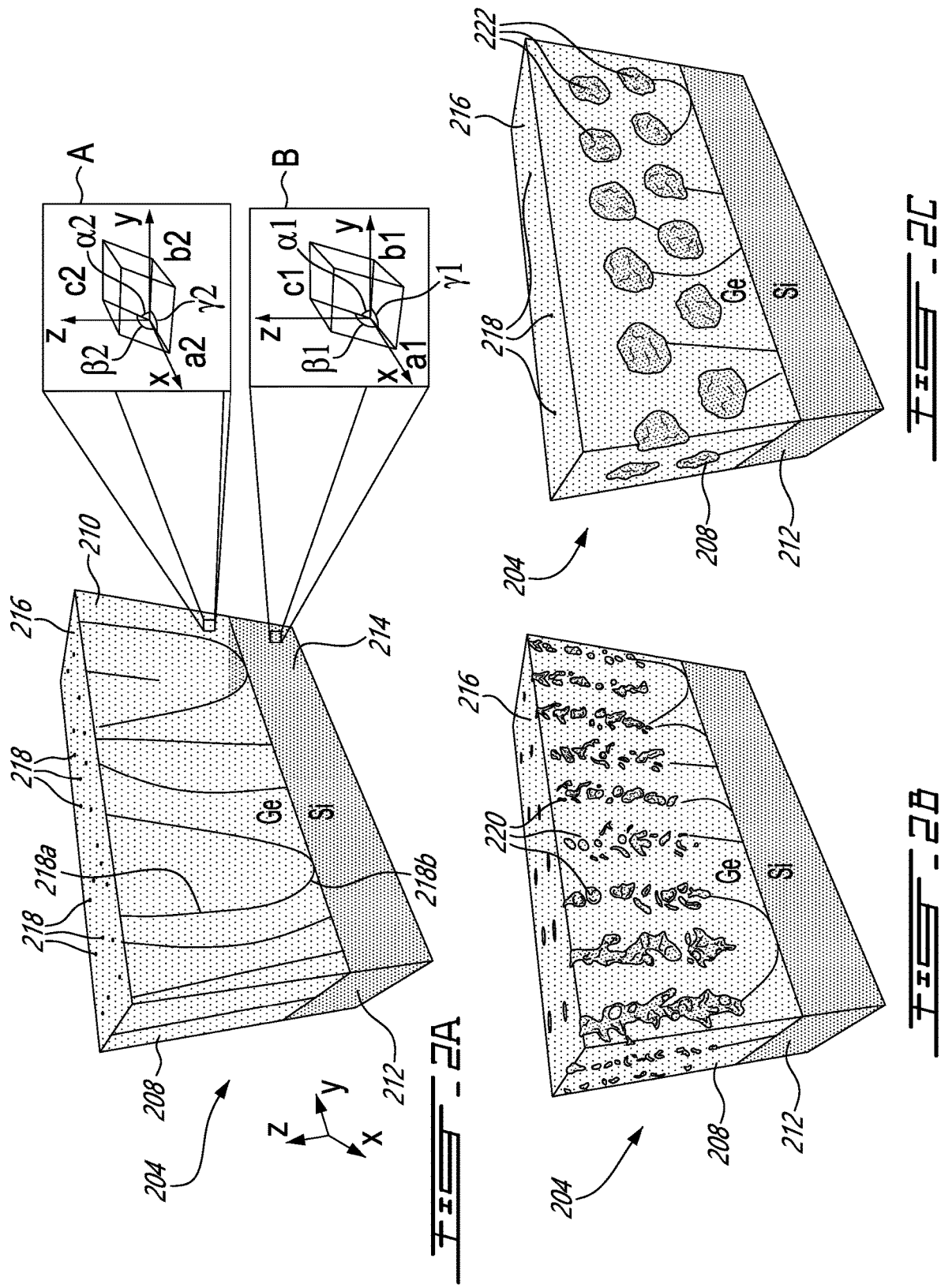
FIG. 2A is an oblique and sectional view of an example of a substrate having first and second layers of different crystalline materials, showing crystalline defects extending from an interface of the first and second layers, in accordance with one or more embodiments.
FIG. 2B is an oblique and sectional view of the substrate of FIG. 2A after an etching step expanding at least some of the crystalline defects into pores, in accordance with one or more embodiments.
FIG. 2C is an oblique and sectional view of the substrate of FIG. 2B after a heating step transforming the pores into defect-attracting nanovoids away from the surface, in accordance with one or more embodiments.

FIG. 2A shows an example of a substrate 204 prior to some of the above-discussed processing steps. As shown, the substrate 204 has a first layer 208 of a first crystalline material 210 supported on a second layer 212 of a second crystalline material 214. It is noted that the first crystalline material 208 is different from the second crystalline material 214 thereby causing crystalline defects 218 exposed at a surface 216 of the first layer 208. Again, in this specific embodiment, the first crystalline material 210 is germanium whereas the second crystalline material 214 is silicon.

In some embodiments, the first crystalline material 210 has a first lattice parameter and the second crystalline material 214 has a second lattice parameter which is mismatched to the first lattice parameter. In this way, the lattice parameter mismatch between the first and second crystalline materials 210 and 214 causes crystalline defects 218 within the first layer 218, at least some of which extends towards the surface 216 of the first layer 208 where they are exposed. Examples of such lattice parameters include, but are not limited to, lattice edge dimensions a, b and c extending along the x-, y- and z-axes, angles formed between the lattice edges α, β and γ and the like, as illustrated in the insets A and B of FIG. 2A. Alternatively or additionally, the first crystalline material 210 has a first coefficient of thermal expansion CTE1 and the second crystalline material 214 has a second coefficient of thermal expansion CTE2 which differs from the first coefficient of thermal expansion CTE1. In these embodiments, the expansion and/or contraction of the first and second crystalline materials 210 and 214 occurring as they experience a similar temperature variation can force the creation of the crystalline defects 218 extending within the first and second layers 208 and 212.

FIG. 2B shows the substrate 204 after the first layer 208 was etched using first etching conditions. The etching step causes at least some of the crystalline defects 218 to expand into pores 220 running from the surface 216 to the first layer 208 towards the second layer 212. By heating the first and second layers 208 and 212 up to a given temperature for a given period of time within a given environment, the pores 220 are transformed into defect-attracting nanovoids 222 concealed within the first layer 208 and away from the surface 216, thereby reducing the density of crystalline defects 218 exposed at the surface 216 of the substrate 204, as shown in FIG. 2C. It is noted that the defect-attracting nanovoids 222 can be in the order of one nanometre, a few nanometres, up to several thousand nanometres. In the latter situation, the defect-attracting nanovoids 222 can thus be in the order of the micrometer as well.

Figure 3:
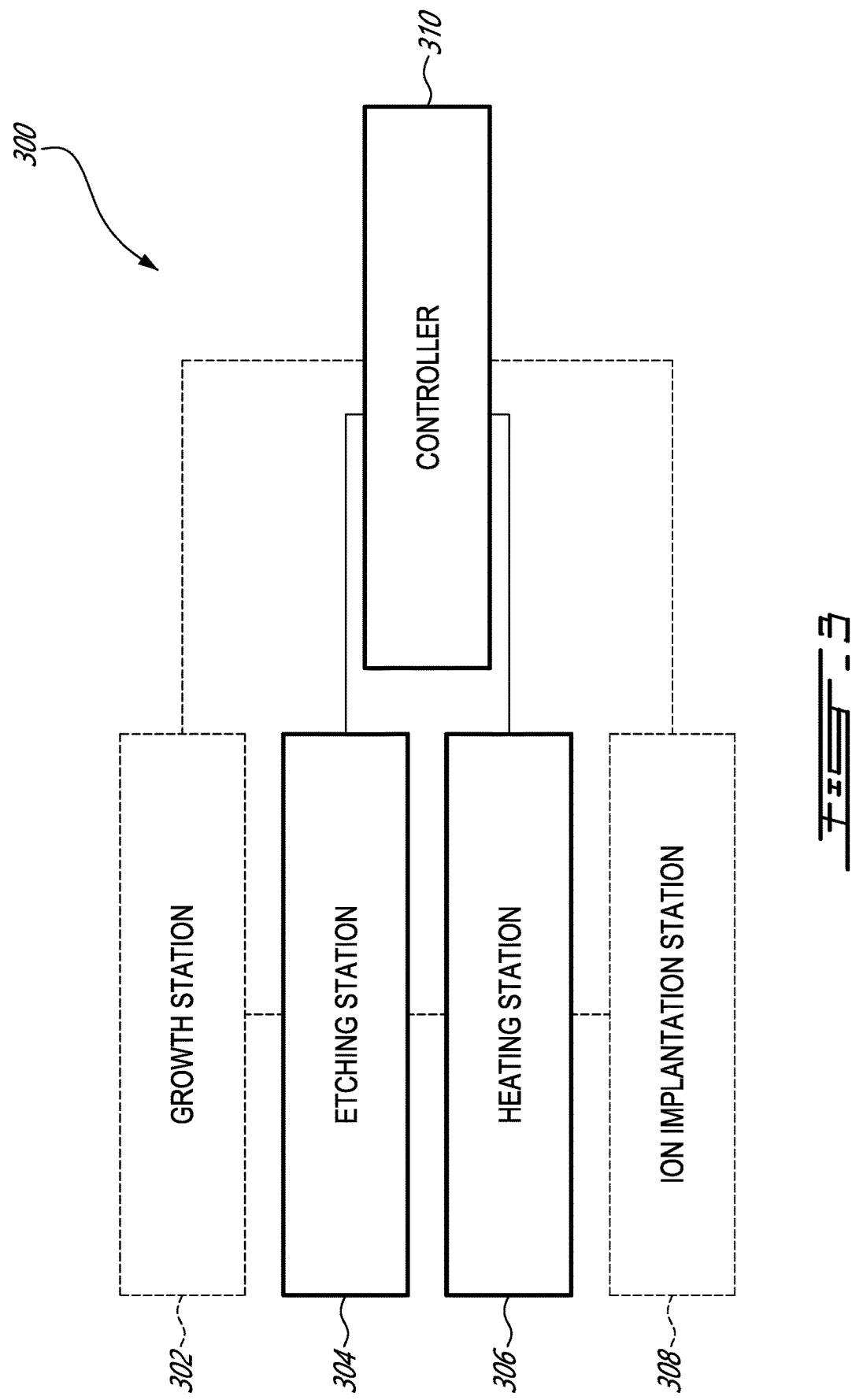
FIG. 3 is a schematic view of an example system for manufacturing substrates for optoelectronic devices, showing stations communicatively coupled to a controller, in accordance with one or more embodiments.
Figure 3E:

These processing steps, as well as other processing steps described below, can be performed by a substrate manufacturing system 300, an example of which is shown in FIG. 3. As illustrated, the substrate manufacturing system 300 can include a growth station 302, an etching station 304, a heating station 306, and an ion implantation station 308 to name a number of possible stations. For instance, the growth station 302 can be used to grow the first layer of the first crystalline material on the second layer of the second crystalline material. In some embodiments, the growth station is optional as the unprocessed multilayered substrate can be received as is from a substrate manufacturer. In some embodiments, the growth station 302 can incorporate a chemical vapour deposition system and any other similar deposition system. In some embodiments, the growth station 302 can include a surface preparation station to prepare the surfaces on which growth is to be performed. However, the surface preparation station can be remote from the growth station 302 in some other embodiments. The etching station 304 can perform the etching step discussed above with reference to FIG. 2B. More specifically, the etching station 304 can create the first etching conditions, or any other etching conditions, upon which at least some of the crystalline defects of the first or second layer are expanded into pores running therein. In some embodiments, the etching station 304 may incorporate one or more electrochemical systems with one or more galvanostatic cells, one or more power supplies and the like. The heating station 306 can perform the heating step discussed above with reference to FIG. 2C. As such, the heating station 306 can heat the first and second layers up to a given temperature for a given period of time within a controlled environment comprising a given gas, for instance. The given gas can contain at least 10% of hydrogen mixed with nitrogen or in a vacuum. The given gas can vary from one embodiment to another. However, an environment exempt of oxygen was found preferable in at least some embodiments. It is noted that the heating station 206 may incorporate a rapid thermal annealing system and the like. The ion implantation station 308 can be used to implant ions within the first and/or second layers of the substrate in some embodiments, examples of which are described below. The ion implantation station 308 can be optional in some embodiments. The stations 302, 304, 306 and 308 can be proximate to or remote from each other, depending on the embodiments. A manipulator can be provided to move the substrate between the stations 302, 304, 306 and 308 in some embodiments. Examples of such manipulators can include, but not limited to, a robot arm, a conveyor belt and the like. Preferably, the processing steps, and the manipulation between the stations are performed within a clean room laboratory environment, as would be apparent to the skilled reader. Moreover, the processing steps may preferably be performed in a swift manner to avoid oxidation of the substrate and its layers by ambient air.

As shown in the depicted embodiment, the stations 302, 304, 306 and 308 can be communicatively coupled to a controller 310 controlling each of the stations and components thereof sequentially performing processing steps on the substrate. The controller 310 can be provided as a combination of hardware and software components. The hardware components can be implemented in the form of a computing device 400, an example of which is described with reference to FIG. 4.

Referring to FIG. 4, the computing device 400 can have a processor 402, a memory 404, and I/O interface 406. Instructions 408 for performing at least some of the processing steps discussed herein can be stored on the memory 404 and accessible by the processor 402.

The processor 402 can be, for example, a general-purpose microprocessor or microcontroller, a digital signal processing (DSP) processor, an integrated circuit, a field-programmable gate array (FPGA), a reconfigurable processor, a programmable read-only memory (PROM), or any combination thereof.

The memory 404 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically erasable programmable read-only memory (EEPROM), Ferroelectric RAM (FRAM) or the like.

Each I/O interface 406 enables the computing device 400 to interconnect with one or more input devices, such as keyboard(s), mouse(s) and the like, or with one or more output devices such as display(s), memory system(s), network(s) and the like. The I/O interface 406 can also enable the computing device 400 to interconnect with the stations 302, 304, 306 and 308, or to components thereof including, but not limited to, crystalline material source(s), etchant source(s), ion source(s) and the like.

Each I/O interface 406 enables the controller 310 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fibre optics, satellite, mobile, wireless (e.g., Wi-Fi, WiMAX), SS7 signalling network, fixed line, local area network, wide area network, and others, including any combination of these.

The computing device 400 and any software application operated by the computing device 400 described herein are meant to be examples only. Other suitable embodiments of the controller 310 can also be provided, as it will be apparent to the skilled reader.

FIG. 5 shows a flow chart of a first example of a method 500 of manufacturing substrates for optoelectronic devices. At least some of the steps of the method 500, or any other method(s) described herein, can be partially or wholly performed by the substrate manufacturing system 300 described with reference to FIG. 3. The steps of the method 500 are described with reference to the substrate 200 of FIGS. 2A-2C for ease of reading.

Referring now to FIGS. 2A and 5, at step 502, there is provided a substrate 204 having a first layer 208 of a first crystalline material 210 supported on a second layer 212 of a second crystalline material 214. As discussed above, the first and second crystalline materials 210 and 214 are different from each other. As shown, some undesirable crystalline defects 218 extend at least within the first layer 208, from a surface 216 of the first layer 208 down towards the second layer 212. Some of the crystalline defects 218 are threading dislocations 218a which extend within the first layer 208, e.g., vertically or obliquely therein. Some other of the crystalline defects 218 are misfit dislocations 218b which extend substantially horizontally along the x- and y-axes. Other types of crystalline defects can also occur.

In some embodiments, the step 502 includes receiving the substrate 204 from a substrate manufacturer, with the first layer 208 of the first crystalline material 210 already supported on the second layer 212 of the second crystalline material 214. In some other embodiments, the step 502 includes receiving a bulk layer of the second crystalline material 214 which acts as the second layer 212 and growing at least the first layer 208 on the second layer 210 using a growth station having a first crystalline material source, for instance. Indeed, in some embodiments, the second layer of the second crystalline material can be received as is from a substrate manufacturer.

Referring now to FIGS. 2B and 5, at step 504, the first layer 208 is etched using first etching conditions, thereby causing some crystalline defects 218 within the first layer 208 to expand into the pores 220 running from the surface 216 of the first layer 208 down towards the second layer 212. After step 504, it is expected that the first layer has a first pore density which can be expressed in terms of a number of pores per unit of volume. As depicted, the pores 220 generally expand about some crystalline defects 218 of the threading dislocation type. In this way, the pores 220 can substantially extend vertically along the z-axis or obliquely within the first layer 208 in this embodiment. However, other types of crystalline defects could also expand into the pores 220 with proper etching conditions.

As will be discussed below, the step 504 is generally performed using electrochemical etching. Accordingly, the step 504 can include a sub-step of chemically interacting with the first layer 208, e.g., by applying one or more etchants from one or more etchant sources, and a sub-step of electrically interacting with the first layer 208, e.g., by applying an electrical signal across the first and/or second layer 208 and 212. Examples of such etchants can include, but not limited to, hydrofluoric acid, hydrofluoric vapour etcher, chloridric acid, hydrochloric acid, hydrogen peroxide ($H_2O_2$), ammonium fluoride, orthophosphoric acid, and any suitable mixture thereof at various concentrations. Examples of such electrical signal can include, but not limited to, oscillating electrical current of different amplitude and/or different frequencies. In some embodiments, the chemical interaction of the etching step can be omitted. In some other embodiments, the electrical interaction of the etching step can be omitted. However, it was found preferably in some embodiments to provide both types of interaction with an electrochemical etching step.

With reference to FIGS. 2C and 5, at step 506, the first and second layers 208 and 212 are heated up to a first temperature for a first period of time within a given environment. The step 506 transforms the pores 220 into nanovoids 222, a process which attracts some of the crystalline defects 218a within the first layer 208 and conceals them away from the surface 216. After step 506, it is expected that the first layer 208 has a first nanovoid density which can be expressed in terms of a number of nanovoid per unit of volume. As shown, the density of the crystalline defects 218 exposed at the surface 216 is reduced from a first defect density, as schematically depicted in FIG. 2A, down to a second defect density, as shown in FIG. 2C.

Referring back to FIG. 5, at step 508, the first and second layers 208 and 212 are cooled down for a given period of time. The cooling down can be complete as its temperature can be reduced until it reaches its preheating temperature, or only partial. The cooling down can be passive or active, depending on the embodiment. Passive cooling down includes letting the first and second layers 208 and 212 lie in a cooler environment for a given period of time. Active cooling may include using a blowing delivering cooler gas upon the first and second layers 208 and 212.

At step 510, the first layer 208 is re-etched using second etching conditions, thereby causing some of the crystalline defects 218 within the first layer 208 to expand into pores 220 running from the surface 216 of the first layer 208 towards the second layer 212. Step 510 generates a greater pore density within the first layer 208. In this way, it is expected that the first layer 208 has a second pore density which is greater than the first pore density. In some embodiments, the second etching conditions of step 510 are different from the first etching conditions of step 504. The etching conditions can differ in terms of etchant types, etchant concentration, electrical signal amplitude, electrical signal frequency, or any combination thereof. In some other embodiments, the first and second etching conditions can be similar from the etching step to the re-etching step.

At step 512, the first and second layers 208 and 212 are reheated up to a second temperature for a second period of time under a given environment. It is expected that the step 512 transforms some of the newly generated pores 220 into defect-attracting nanovoids 222. After step 512, it is expected that the first layer 208 has a second nanovoid density greater than the first nanovoid density. In this way, performing a first cycle comprising steps 504, 506 and 508 can reduce the defect density from a first defect density down to a second defect density. Moreover, performing a second cycle comprising steps 510 and 512 can reduce the defect density from the second defect density down to a third defect density.

Loop 514 shows that the steps 508, 510 and 512 can be repeated a number of times to increase the pore and nanovoid densities incrementally at each loop 514, which in turn can incrementally reduce the density of defects exposed at the surface 216 of the first layer 208.

Similarly, in some embodiments, the conditions in which the steps 506 and 512 of heating and reheating are performed are similar. In some other embodiments, the first and second temperatures can be different from one another. Alternatively, or additionally, the first and second periods of time can be different as well. The given gas in which the heating occurs can also differ, in some embodiments. For instance, the second temperature can be greater than the first temperature. In some embodiments, the first temperature is at least 550° C. whereas the second temperature is at least 700° C. Similarly, the second period of time can be greater than the first period of time. In some embodiments, the first period of time is at least 5 minutes whereas the second period of time is at least 10 minutes.

In some other embodiments, the method 500 has two cycles. The first cycle includes a step of etching with first etching conditions, and a step of heating at 550 degrees Celsius for 5 min within a given gas. The second cycle includes a step of etching with the first etching conditions, and a step of heating at 550 degrees Celsius for 5 min within the given gas. In a preferred embodiment, a third cycle is also performed. The third cycle includes a first step of etching with second etching conditions different from the first etching conditions, and a second step of heating the first and second layers at 700 degrees Celsius for 10 minutes under the same given gas.

It is encompassed that, at least in some embodiments, the step 510 of re-etching the first layer 208 can be omitted. Indeed, in these embodiments, the first and second layers 208 and 212 can be etched a sole time as per step 504, and then be heated and reheated as per steps 506 and 512, preferably with a cooling down step in between. In these embodiments, the step 512 of reheating can increase the density of the nanovoids within the first layer 208 from a first nanovoid density to a second nanovoid density, even if the step 510 of re-etching has been omitted.

FIGS. 6A-6D show scanning electron microscopy images of an example substrate 604 at different steps of the method 500 of FIG. 5. More specifically, FIG. 6A shows the substrate 604 after the step 504 of etching the first layer 608 with first etching conditions and showing pores 220 at a first pore density. FIG. 6B shows the substrate 604 after the step 506 of heating the first layer 208 up to a first temperature for a first period of time, thereby transforming the pores 220 into nanovoids 222, thereby turning the first pore density into a first nanovoid density. FIGS. 6C and 6D show the substrate 604 after a second iteration of the etching and heating steps. More specifically, FIG. 6C shows the substrate 604 after the step 510 of re-etching the first layer 208 with second etching conditions and showing a second pore density which is greater than the first pore density. FIG. 6D shows the substrate 604 after the step 512 of reheating the first and second layers up to a second temperature for a second period of time, thereby transforming the second pore density into a second nanovoid density which is greater than the first nanovoid density. In some embodiments, once the loop 514 has been performed satisfactorily, an optional step 516 of growing an epi-ready layer of the first crystalline material, e.g., germanium, on the first layer can be performed to reduce surface roughness. An example of such an epi-ready layer 615 is shown in FIG. 6E. Such an additional step may be necessary in situations where etching and heating conditions of the steps 504, 506, 510 and 512 would alter the surface to the point where growing the semiconductor components would not be possible. Once the epi-ready layer has been grown, the resulting substrate would be ready to receive any suitable semiconductor component.

FIG. 7 shows a flow chart of a second example of a method 700 of manufacturing substrates for optoelectronic devices.

At step 702, there is provided a substrate having a first layer of a first crystalline material supported on a second layer of a second crystalline material which is different from the first crystalline material. Step 702 is similar to step 502 described above with respect to method 500.

At step 704, a pore containing region is formed within the first layer. The pore containing region is formed away from a surface of the first layer and concealed therefrom.

At step 706, the first layer is etched using first etching conditions, thereby causing some crystalline defects within the first layer to expand into pores running from the surface of the first layer down towards the second layer. Step 706 is similar to step 504 described above with respect to method 500.

At step 708, the first and second layers are heated up to a first temperature for a first period of time. The step 708 transforms the pores into nanovoids which attract some of the crystalline defects within the first layer and away from the surface. Step 708 is similar to step 506 described above with respect to method 500.

In some embodiments, once the steps 702 to 708 have been performed satisfactorily, an optional step 710 of growing an epi-ready layer of the first crystalline material, e.g., germanium, on the first layer can be performed to reduce surface roughness and further remove the nanovoids from the surface.

What differs from the method 500 is that the pore containing region has, when etched at step 706, a density of crystalline defects expanding into pores which is greater than elsewhere within the first layer, and which is also greater than the defect density that would be expected should the pore containing region be omitted. As such, when heated at step 708, the pore containing region conceals nanovoids therewithin thereby defining a nanovoid-free region between the pore containing region and the surface of the first layer. As the pore density is greater within the first layer, and especially within the pore containing region, it is expected that, upon heating, a greater number of pores will be transformed into defect-attracting nanovoids, thereby reducing the defect density exposed at the surface of the first layer.

FIGS. 8-15 show different substrates manufactured using the method 700. As will be described below, the pore containing region can be formed using different processing techniques, different materials, different doping level, different doping types, or any combination thereof. The pore containing region can lie directly on the second layer in some embodiments. However, in some other embodiments, the pore containing region can be sandwiched between a nanovoid-free region proximate to the surface of the first layer, and an optional layer which itself lies on the second layer. In alternate embodiments, more than one optional layer can be provided below the pore containing region, if necessary. In some embodiments, the pore containing region can also be in the second layer and/or at the interface of the first and the second layer.

In some embodiments, the pore containing region is made of an alloy comprising both the first and second crystalline materials, examples of which are described with reference to FIGS. 8 and 9.

More specifically, referring now to the rightmost figure of FIG. 8, there is shown an example substrate 804 for an optoelectronic device. As depicted, the substrate 804 has a first layer 808 of a first crystalline material 810 supported on a second layer 812 of a second crystalline material 814 which is different from the first crystalline material 810. The first layer 808 has a nanovoid free region 824 which exposes a surface 816 of the first layer 808, and a nanovoid concealing region 826 below the nanovoid-free region 824, and/or at an interface of thereof, and away from the exposed surface 816. As shown in this embodiment, the nanovoid concealing region 826 has an alloy having both the first and second crystalline materials 810 and 814 and a plurality of defect-attracting nanovoids 822 distributed within the nanovoid concealing region 826.

The substrate 804 can be manufactured using the method 700 of FIG. 7. Example steps of manufacturing the substrate 804 are described by referring to the figures of FIG. 8, from left to right. In this specific example, the steps 702 and 704 include providing the second layer 812 of a crystalline material A, supporting a first layer 808 of a crystalline material B upon the second layer 812, with the first layer 808 including a pore containing region 828 upon the second layer 812. As shown, the pore containing region 828 is away from the surface 816 thereby leaving a region 830 of the crystalline material B upon the pore containing region 828. As shown, the latter regions 828 and 830 form the first layer 808. As described above, in this embodiment, the pore containing region 828 is formed by providing an alloy AB of the crystalline materials A and B upon the second layer 812, where the crystalline materials A and B are different from one another. In some embodiments, the alloy consists of 80% of the crystalline material A and 20% of the crystalline material B, i.e., an $A_{80\%}B_{20\%}$ alloy. However, the percentage of each of the crystalline materials A and B can differ from one embodiment to another. In some other embodiments, the concentration of the crystalline materials A and B can vary in a gradually and continuous manner between the first and second layers 808 and 812. The gradient at which these concentrations vary can be linear in some specific embodiments.

As shown, the pore containing region 828 has, when etched at step 706, a density D1 of crystalline defects expanding into pores 820 which is greater than elsewhere within the first layer 808, e.g., greater than a density D2 of crystalline defects within the region 830 or within any optional layer below the pore containing region 828. As such, when heated at step 708, the pore containing region 828 will conceal defect-attracting nanovoids therewithin, becoming the nanovoid concealing region 826. The region 830 thereby turns into the nanovoid-free region 824 lying between the nanovoid concealing region 826 and the surface 816 of the first layer 808.

FIG. 9 shows another example of a substrate 904 for an optoelectronic device in which the first crystalline material is germanium whereas the second crystalline material is silicon. Example steps of manufacturing the substrate 904 are shown from left to right in FIG. 9. In this specific example, the steps 702 and 704 include providing a second layer 912 of silicon, supporting a first layer 908 of germanium upon the second layer 912, with the first layer 908 having an optional layer 932 of germanium upon the second layer 912, a pore containing region 928 upon the optional layer 932, and a top region 930 upon the pore containing region 928. As shown, the pore containing region 928 is away from the surface 916. In this specific example, the regions 928, 930 and 932 form the first layer 908. As described above, the pore containing region 928 is formed by growing an alloy of silicon-germanium in this specific example. As such, when etched and heated at steps 706 and 708, the pore containing region 928 will conceal nanovoids therewithin, becoming the nanovoid-concealing region 926, thereby defining a nanovoid-free region 924 between the nanovoid-concealing region 926 and the surface 916 of the first layer 908.

In some embodiments, the pore containing region is made of a region with a greater level of dopants than elsewhere within the first layer, examples of which are shown in FIGS. 10 and 11.

FIG. 10 shows another example of a substrate 1004 manufactured using the method 700. More specifically, referring to the rightmost figure of FIG. 10, the substrate 1004 has a first layer 1008 of a first crystalline material supported on a second layer 1012 of a second crystalline material different from the first crystalline material. The first layer 1008 has a nanovoid free region 1024 which has a first doping level and which exposes a surface 1016. The first layer 1008 also has a nanovoid concealing region 1026 below the nanovoid-free region 1024 and which lies away from the exposed surface 1016. The nanovoid concealing region 1026 has a second doping level which is greater than the first doping level and a plurality of defect-attracting nanovoids 1022 distributed therewithin. As such, the nanovoid concealing region 1026 has a doping level which is greater than that of the nanovoid free region 1024 or of the optional layer 1032. For instance, dopant(s) such as Phosphorous (P), Arsenic (As) or Antimony (Sb) can be used to n-type dope germanium. In some other instances, Boron (B) can be used to p-type dope germanium. It was found convenient to provide the doping level of the pore containing region to be greater by at least an order of magnitude, or preferably at least two orders of magnitude, than a doping level of the remainder of the first layer, e.g., $10^{10}$ vs $10^9$ dopants/$cm^3$, $10^{14}$ vs $10^{12}$ dopants/$cm^3$ In some embodiments, the dopant level can be measured using tools such as a spreading resistance profile measurement system, a secondary ion mass spectrometer (SIMS) and the like.

Specifically, in this example, the step 704 of forming the pore containing region 1028 includes a step of growing the first crystalline material with a first doping level upon the second layer 1008 thereby forming the pore containing region 1028, and then growing the first crystalline material with a second doping level which is lower than the first doping level on the pore containing region 1028. As such, when etched and heated according to steps 706 and 708, the first layer 1008 has a nanovoid free region 1024 where the first crystalline material has been grown with the second doping level. The first layer 1008 also has a nanovoid concealing region 1026 below the nanovoid-free region 1024 and away from the exposed surface 1016.

FIG. 11 shows another example of a substrate 1104 manufactured using the method 700. As shown, the substrates 1004 and 1104 are similar to one another in composition. However, the substrate 1104 has been manufactured using a different method. In this specific example, the step 704 of forming the pore containing region 1128 has a step of growing the first crystalline material with a first doping level upon the second layer 1112 to form the first layer 1108. Then, dopants are implanted within a region 1128 of the first layer 1108 thereby increasing a doping level of the region 1128 from the first doping level to the second doping level. The ion implantation profile 1140 shows how much ions are implanted within the first and where these dopants are implanted as a function of the depth z across the first layer 1108. As shown, the implantation of the ions is concentrated within the region 1128 where more ions are implanted. As can be expected, the implantation of ions changes the doping level proportionally. When such ions are activated by an additional heating step the region 1128 becomes the pore containing region 1128 after said ion implantation, which will be transformed gradually into the nanovoid concealing region 1126 after the steps 706 of etching and 708 of heating.

In some embodiments, the pore containing region is made of a region with a different dopant type than elsewhere within the first layer, examples of which are shown in FIGS. 12 and 13.

FIG. 12 shows an example of a substrate 1204 for an optoelectronic device. As depicted in the rightmost figure of FIG. 12, the substrate 1204 has a first layer 1208 of a first crystalline material supported on a second layer 1212 of a second crystalline material different from the first crystalline material. The first layer 1208 has a nanovoid free region 1226 with a p-type dopant and exposing a surface 1216. The first layer 1208 has a nanovoid concealing region 1226 below the nanovoid-free region 1224 and away from the exposed surface 1216. As shown in this example, the nanovoid concealing region has an n-type dopant and a plurality of defect-attracting nanovoids 1222 distributed therewithin.

It is encompassed that the nanovoid concealing region 1226 can have any one of an n-type dopant and a p-type dopant, as long as the nanovoid-free region 1224 has the other one of the n-type dopant and the p-type dopant.

Specifically, in this example, the step 704 of forming the pore containing region 1128 includes a step of growing the first crystalline material with an n-type dopant upon the second layer 1208 thereby forming the pore containing region 1228, and then growing a region 1230 comprising the first crystalline material with the p-type dopant on the pore containing region 1228. As such, when etched and heated according to steps 706 and 708, the first layer 1208 turns into a nanovoid-free region 1224 where the first crystalline material is p-type-doped and into a nanovoid-concealing region 1226 below the nanovoid-free region 1224, away from the exposed surface 1216, where the first crystalline material is n-doped.

FIG. 13 shows another example of a substrate 1304 manufactured using the method 700. As shown, the substrates 1204 and 1304 are similar to one another in composition. However, the substrate 1304 has been manufactured differently. In this specific example, the step 704 of forming the pore containing region 1328 has a step of growing the first crystalline material with a p-type dopant upon the second layer 1312 to form the first layer 1308. Then, n-type dopants are implanted within a region 1328 of the first layer 1308 thereby n-doping the p-type doped first crystalline material within the region 1328. The ion implantation profile 1340 shows the implantation strength as a function of the depth z across the first layer 1308. As shown, the region 1328 where the n-type doped ions have been implanted is the pore containing region 1328 which will be transformed gradually into the nanovoid concealing region 1326 after the steps 706 of etching and 708 of heating. In some other embodiments, the pore containing region can have a combination of n- and p-type dopants such as in a p-n junction. In these embodiments, the etching step can occur only in leakage zones embodied by the dislocations.

In some other embodiments, the pore containing region can be made by successively etching the first layer with different etching conditions, examples of which are shown in FIGS. 14 and 15.

More specifically, the step 704 of forming the pore containing region can include a first step 706a of etching a first layer 1408 with first etching conditions and then a second step 706b of etching the etched first layer 1408 with second etching conditions which are different from the first etching conditions. In these embodiments, the second step 706b of etching forms a pore containing region 1428 within the first layer 1408 away from the exposed surface 1406. As discussed above, the pore containing region 1428 has, upon step 706 of etching, a density of crystalline defects expanding into pores 1420 which is greater than elsewhere within the first layer 1408. Upon step 708 of heating, nanovoids 1422 conceal the pores 1420 within the pore containing region 1428 thereby defining a nanovoid-free region 1424 between the pore containing region 1426 and the exposed surface 1416.

FIG. 14 shows an example in which the first etching conditions involve applying a first electrolyte solution 1442 and in which the second etching conditions involve applying a second electrolyte solution 1444 which is more etchant than the first electrolyte solution 1442. An example of the first electrolyte solution can include, but not limited to, a mixture of 30% Hydrogen peroxide ($H_2O_2$) and 5% HF while an example of the second electrolyte solution can include, but not limited to a 5:1 ratio of 49% HF and anhydrous ethanol. In some other embodiments, the first electrolyte solution can have a given electrolyte at a first concentration whereas the second electrolyte solution can have the given electrolyte at a second concentration which is greater than the first concentration. For instance, the first etching conditions can include a 5:1 ratio of 25% HF and anhydrous ethanol while the second etching conditions can include a 5:1 ratio of 49% HF and anhydrous ethanol. In some other embodiments, the first electrolyte solution can have a first electrolyte whereas the second electrolyte solution can have a second electrolyte which is more etchant than the first electrolyte. In some embodiments, the first etching conditions can include 36% HCl whereas the second etching conditions can include a 5:1 ratio of 49% HF and anhydrous ethanol. The first electrolyte solution can include a mixture of 30% Hydrogen peroxide ($H_2O_2$) and 5% HF while the second electrolyte solution can include a 5:1 ratio of 49% HF and anhydrous ethanol.

FIG. 15 shows an example in which the first etching conditions involve applying a first oscillating current S1 whereas the second etching conditions involve applying a second oscillating current S2, the first and second oscillating currents being different from one another. The oscillating currents can be an electrical current oscillating between an anodic current amplitude and a cathodic current amplitude at a given frequency. For instance, the first etching conditions can involve alternately applying ±1 mA/cm$^2$ with pulse durations of 1 s during 5 min while the second etching conditions can involve applying alternately ±4 mA/cm$^2$ with pulse durations of 1 s during 10 min. It is noted that the amplitude, frequency and duration can vary as a function of a thickness, a morphology and a porosity of the first layer, for instance. In this specific example, the first step 706a of etching is performed using a first electrical current oscillating between a first anodic amplitude and a second cathodic amplitude at a first frequency and the second step 706b of etching is performed using a second electrical current oscillating between a second anodic amplitude and a second cathodic amplitude at a second frequency. In some embodiments, the second cathodic amplitude is greater than the first cathodic amplitude. Additionally or alternatively, the second anodic amplitude is greater than the first anodic amplitude. In yet other embodiments, the second frequency of the second oscillating current and be greater than the first frequency of the first oscillating current. The type of oscillation of the first and second oscillating currents can be sinusoidal, step-like or any other suitable type. In some embodiments, the electrical signals are not oscillating.

FIG. 16 shows a flow chart of a third example of a method 1600 of manufacturing substrates for optoelectronic devices.

At step 1602, there is provided a substrate having a first layer of a first crystalline material supported on a second layer of a second crystalline material which is different from the first crystalline material. Step 1602 is similar to steps 502 and 702 described above with respect to methods 500 and 700, respectively.

At step 1604, dopants are implanted within the first layer. The dopants are preferably implanted uniformly within the first layer, i.e., i.e., the dopants have implanted using a sequence of several implantation steps with cumulative ion fluences and energies. By implanting these dopants, the implanted dopants are attracted proximate to some of the crystalline defects extending within the first layer. It is noted that in embodiments where the first layer is p-type doped, the implanted dopants are also p-type doped as well. However, in embodiments where the first layer is n-type doped, the implanted dopants are n-type doped.

At step 1606, the implanted dopants are activated at least some of the crystalline defects are transformed into nanochannels running from the exposed surface of the first layer down to the second layer. In some embodiments, the activation of the dopants is performed by heating the first and second layers up to a given temperature for a given period of time under a given environment. For instance, a n-type dopant can be activated by performing a phosphorus annealing step, which include heating at about 700° C.-800° C. for about 100 s. In some other embodiments, a laser beam can be used to heat a portion of the first layer which is to be activated.

At step 1608, the second layer is etched through the first layer via the nanochannels. Indeed, once the nanochannels are formed throughout the first layer, etching the first layer causes any etchant to travel through the first layer via the nanochannels, which in turn etches the second layer supporting the first layer instead of only etching the first layer. Such etching will cause at least some of the crystalline defects extending within the second layer to expand into pores running with the second layer.

At step 1610, the first and second layers are heated up to a first temperature for a first period of time under a given environment. As discussed above, this step transforms the pores of the second layer into nanovoids, which attract at least some of the crystalline defects within the second layer and away from the first layer. In this way, a nanovoid-free region is defined within the second layer and/or at the interface of the first and second layers.

In some embodiments, once the steps 1602 to 1610 have been performed satisfactorily, an optional step 1612 of growing an epi-ready layer of the first crystalline material, e.g., germanium, on the first layer can be performed to reduce surface roughness.

Figure 17:
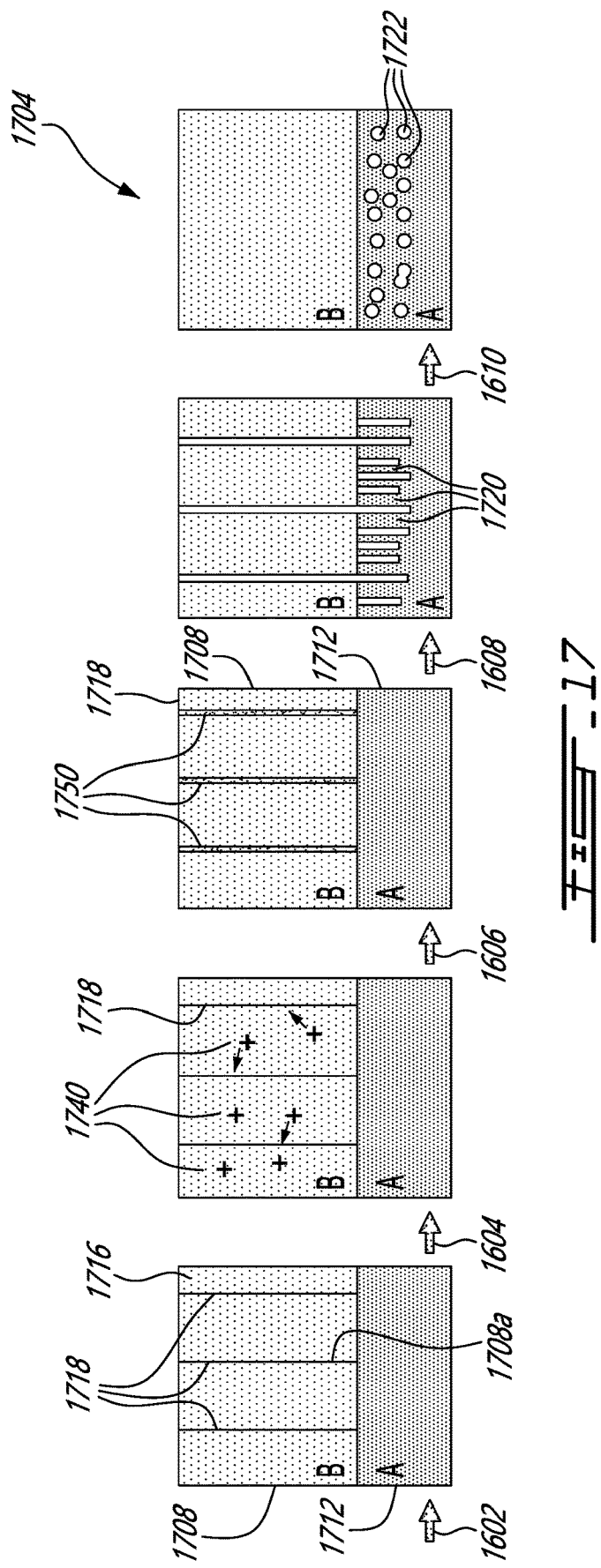
FIG. 17 is a schematic view of an example of a substrate manufactured using the method of FIG. 16, showing nanochannels running across the first layer and a pore containing region within the second layer of the substrate, in accordance with one or more embodiments.

FIG. 17 shows a substrate 1704 manufactured using the method 1600. Example steps of manufacturing a substrate 1704 are illustrated from left to right in FIG. 17. As depicted, a substrate having a first layer 1708 of a first crystalline material is supported on a second layer 1712 of a second crystalline material different from the first crystalline material. As can be expected due to a lattice constant mismatch between the first and second crystalline materials, some undesirable crystalline defects 1718 extend within the first layers 1708 and 1712. For instance, threading dislocations 1718a extend from a surface 1716 of the first layer 1708 and can extend to an interface of the first and second layers 1708 and 1712. At step 1604, dopants 1740 are implanted within the first layer 1708. As the dopants 1740 are charged (e.g., positively charged, negatively charged), the dopants 1740 tend to be attracted by the crystalline defects 1718 which are per definition also charged. As per step 1606, the dopants 1740 are activated thereby transforming the dopant filled crystalline defects 1718 into nanochannels 1750 running from the exposed surface 1718 of the first layer 1708 down to the interface of the first and second layers 1708 and 1712. When an etchant and/or an electrical signal is(are) applied on the first layer 1708, as per step 1608, the etchant and/or electrical signal flow(s) within the nanochannels 1750 thereby reaching and etching the second layer 1712. As such, the second layer 1712 is etched through the first layer 1708 via the nanochannels 1750. This will cause the formation of pores 1720 within the second layer 1712. As per step 1610, heating of the first and second layers 1708 and 1712 transform the pores 1720 into defect-attracting nanovoids 1722 attracting some of the crystalline defects 1718 to the nearest free surface area (e.g., voids inside the second layer 1712). As such, the defect density can be reduced in the first layer 1708 by a nanovoid concealing region extending within the second layer 1712.

Figure 18:
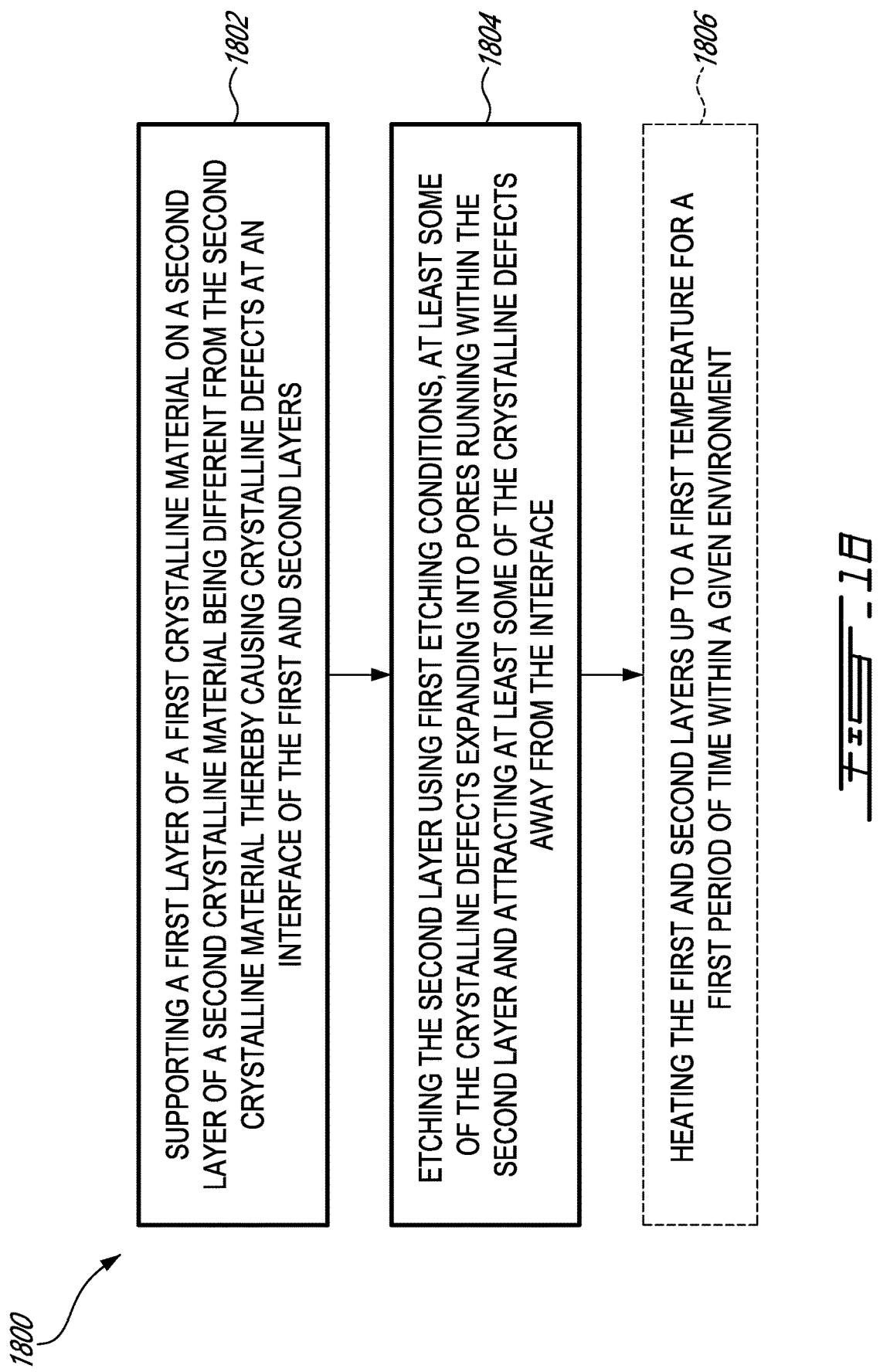
FIG. 18 is a flow chart of a first example of a method of manufacturing substrates for optoelectronic devices, showing a step of etching the second layer with first etching conditions, in accordance with one or more embodiments.

FIG. 18 shows a flow chart of a fourth example of a method 1800 of manufacturing substrates for optoelectronic devices. The steps of the method 1800 are described with reference to the substrate 1904 of FIG. 19 for ease of reading.

Figure 19:
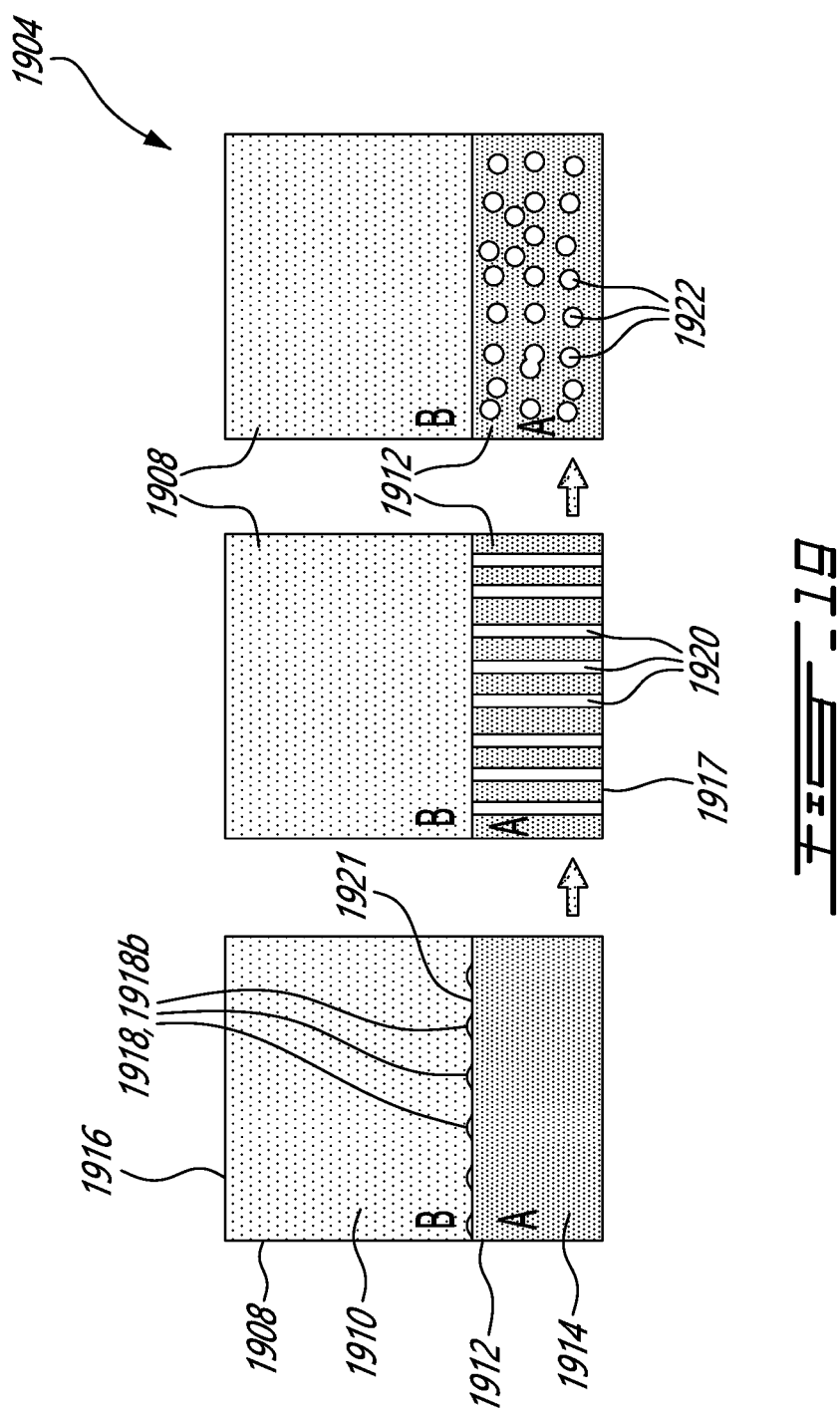
FIG. 19 is a schematic view of an example of a substrate manufactured using the method of FIG. 18, showing pores contained within the second layer, in accordance with one or more embodiments.

Referring now to FIGS. 18 and 19, at step 1802, there is provided a substrate 1904 having a first layer 1908 of a first crystalline material 1910 supported on a second layer 1912 of a second crystalline material 1914. As discussed above, the first and second crystalline materials 1910 and 1914 are different from each other. As shown, some undesirable crystalline defects 1918, such as misfit dislocations 1918b, are present at an interface 1921 of the first and second layers 1908 and 1912.

At step 1804, the first layer 1908 is etched using first etching conditions, thereby causing at least some of the crystalline defects 1918 to expand into pores 1920 running within the second layer 1912 and attracting the crystalline defects 1918 away from the interface 1921. It is noted that the step 1804 of etching can increase the porosity of the second layer 1912 and thereby allow its second crystalline material to adjust its crystalline constant(s) to the crystalline constant(s) of the first crystalline material of the first layer. The elastic modulus of the first layer is reduced due to its porosity and the substrate can be stretched, compressed, and deformed. The first layer is therefore expected to accommodate the mismatch of the second layer and to serve as a mechanically stretchable compliant substrate. As such, a lesser number of crystalline defects may be present at least at the interface 1921 due to matching crystalline constants. In some embodiments, the pores 1920 can substantially extend vertically along the z-axis or obliquely within the second layer 1912 in this embodiment. However, other types of crystalline defects could also expand into the pores 1920 with proper etching conditions.

As will be discussed below, the step 1804 is generally performed using electrochemical etching. Accordingly, the step 1804 can include a sub-step of chemically interacting with the second layer 1912, e.g., by applying one or more etchants from one or more etchant sources, and a sub-step of electrically interacting with the second layer 1912, e.g., by applying an electrical signal across the first and/or second layer 1908 and 1912. Examples of such etchants can include, but not limited to, hydrofluoric acid, hydrofluoric vapour etcher, chlorhydric acid, hydrochloric acid, hydrogen peroxide ($H_2O_2$), ammonium fluoride, orthophosphoric acid, and any suitable mixture thereof at various concentrations. Examples of such electrical signal can include, but not limited to, oscillating electrical current of different amplitude and/or different frequencies. In some embodiments, the chemical interaction of the etching step can be omitted. In some other embodiments, the electrical interaction of the etching step can be omitted. However, it was found preferably in some embodiments to provide both types of interaction with an electrochemical etching step.

At step 1806, the first and second layers 1908 and 1912 are heated up to a first temperature for a first period of time within a given environment. It is noted that the step 1806 is optional in the method 1800, as only the step 1804 of etching may be sufficient to attract misfit dislocations 1918b of the interface 1921 away from the first layer 1908. The step 1806 transforms the pores 1920 into nanovoids 1922, a process which can attract some of the crystalline defects of the first layer 1908, the second layer 1912, or both, and conceals them away from a semiconductor component receiving surface 1916 of the first layer 1908. After step 1806, it is expected that the second layer 1912 has a first nanovoid density which can be expressed in terms of a number of nanovoids per unit of volume. As shown, the density of the crystalline defects 1918 exposed at the surface 1916 is reduced from a first defect density down to a second defect density. In some embodiments, especially those where the second crystalline material is silicon, the step 1806 of heating may be omitted as it would necessitate temperatures that are too high, and which could damage the first layer and/or be most resource consuming.

In some embodiments, the method 1800 can have a step of cooling down the first and second layers and a subsequent step of reheating the first and second layers 1908 and 1912 up to a second temperature for a second period of time. The second temperature may be greater than the first temperature. For instance, the first temperature can be at least 550° C. and the second temperature can be at least 700° C. The second period of time can be greater than the first period of time. For instance, the first period of time can be at least 5 minutes and the second period of time can be at least 10 minutes.

The method 1800 can also have a step of, prior to the step of reheating, re-etching the second layer 1912 using second etching conditions. The first and second etching conditions can be different from each other, as discussed above with respect to other embodiments.

In some embodiments, the step 1802 can include a step of forming a pore containing region within the second layer 1912, the pore containing region having, upon said step 1804 of etching, a density of crystalline defects expanding into pores being greater than elsewhere within the second layer 1912 thereby concealing, upon said step 1804 of heating, the nanovoids 1920 within the pore containing region and defining a nanovoid-free region between the pore containing region and the semiconductor component receiving surface 1916.

As can be understood, the examples described above and illustrated are intended to be exemplary only. For instance, it is encompassed that multilayered substrates can be manufactured for solar cell applications by doping the first layer with a p-type dopant (e.g., using pGe—Si). In alternate embodiments, it is encompassed that multilayered substrates can be manufactured for laser applications by doping the first layer with an n-type dopant (e.g., nGe—Si). The first layer can include a sandwich of n/p/n-types dopant in some embodiments whereas the first layer can include a sandwich of p/n/p-type dopants in some other embodiments. Although the disclosure is geared towards technologies closely related to the GaAs semiconductor system, requiring germanium as the crystalline material for the first layer. However, it is envisaged that the methods and substrates disclosed herein can be geared towards technologies closely related to the InP semiconductor system. In these embodiments, InGaAs may be used as the crystalline material for the first layer. As such, one can potentially manufacture an engineered substrate with a lattice constant from 5.65 Å (e.g., for the GaAs semiconductor system), all the way up to 6.05 Å (e.g., for the InAs semiconductor system), covering major III-V semiconductor technologies, except for the GaN semiconductor system. As for the nitride system, AlInN or GaInN can be used as the crystalline material of the first layer to cover the whole III-N semiconductor system. In some embodiments, the step of providing the substrate includes a step of forming three-dimensional shapes or forms, e.g., photolithography, within or on the first layer of germanium. The scope is indicated by the appended claims.

What is claimed is:

1. A method of manufacturing a substrate for an optoelectronic device, the method comprising:
supporting a first layer of a first crystalline material on a second layer of a second crystalline material being different from said first crystalline material thereby exposing crystalline defects at a surface of said first layer;
etching said first layer using first etching conditions, said etching electrically interacting with at least some of said crystalline defects, said electrically interacting resulting in said crystalline defects expanding into pores running from said surface of the first layer towards said second layer, said pores extending within a volume of said first layer; and
heating said first and second layers up to a first temperature for a first period of time within a given environment, said heating transforming said pores into nanovoids attracting at least some of said crystalline defects away from said surface.

2. The method of claim 1 further comprising cooling down said first and second layers and reheating said first and second layers up to a second temperature for a second period of time.

3. The method of claim 2 wherein said second temperature is greater than said first temperature.

4. The method of claim 3 wherein said first temperature is at least 550° C. and said second temperature is at least 700° C.

5. The method of claim 2 wherein said second period of time is greater than said first period of time.

6. The method of claim 2 further comprising, prior to said reheating, re-etching said first layer using second etching conditions.

7. The method of claim 1 wherein said supporting comprises forming a pore containing region within said first layer away from said surface, the pore containing region having, upon said etching, a density of crystalline defects expanding into pores being greater than elsewhere within the first layer thereby concealing, upon said heating, the nanovoids within said pore containing region and defining a nanovoid-free region between said pore containing region and said surface.

8. The method of claim 7 wherein said pore containing region is made of an alloy comprising both the first and second crystalline materials.

9. The method of claim 8 wherein said forming comprises growing said alloy upon said second layer thereby forming said pore containing region, and then growing said first crystalline material on said pore containing region.

10. The method of claim 7 wherein the pore containing region has a doping level being greater than a doping level of elsewhere within the first layer.

11. The method of claim 10 wherein said forming comprises growing said first crystalline material with a first doping level upon said second layer thereby forming said pore containing region, and then growing said first crystalline material with a second doping level being lower than the first doping level on said pore containing region thereby forming said nanovoid-free region.

12. The method of claim 10 wherein said forming comprises growing said first crystalline material with a first doping level upon said second layer, and then implanting dopants within a region of said first layer thereby increasing a doping level of said region from the first doping level to the second doping level, said region acting as said pore containing region after said implanting.

13. The method of claim 7 wherein the pore containing region has one of a n-type dopant and a p-type dopant, the nanovoid-free region having the other one of the n-type dopant and the p-type dopant.

14. The method of claim 1 wherein said etching comprises a first step of etching the first layer with first etching conditions and then a second step of etching the etched first layer with second etching conditions, the second step of etching forming a pore containing region within said first layer away from said surface, the pore containing region having, upon said steps of etching, a density of crystalline defects expanding into pores being greater than elsewhere within the first layer thereby concealing, upon said heating, the nanovoids within said pore containing region and defining a nanovoid-free region between said pore containing region and said surface.

15. The method of claim 14 wherein the first etching conditions involve a first electrolyte solution and wherein the second etching conditions involve a second electrolyte solution being more chemically active than the first electrolyte solution.

16. The method of claim 1 further comprising, prior to said etching, implanting dopants uniformly within the first layer, said implanted dopants being attracted proximate to said crystalline defects, activating the implanted dopants thereby transforming at least some of the crystalline defects into nanochannels running from the surface of the first layer down to the second layer, wherein said step of etching is performed through said first layer via said nanochannels, at least some of the crystalline defects expanding into pores running within the second layer and away from the first layer, said heating transforming said pores of said second layer into nanovoids attracting at least some of said crystalline defects within said second layer and away from said first layer, thereby defining a nanovoid-free region within first second layer.

17. The method of claim 1 wherein said pores reach a volume of said second layer.

18. The method of claim 1 wherein said pores extend within a volume of said second layer.

* * * * *